US011394311B2

(12) United States Patent
Uneme

(10) Patent No.: US 11,394,311 B2
(45) Date of Patent: Jul. 19, 2022

(54) POWER CONVERSION APPARATUS

(71) Applicant: HONDA MOTOR CO., LTD., Tokyo (JP)

(72) Inventor: Takahiro Uneme, Wako (JP)

(73) Assignee: HONDA MOTOR CO., LTD., Tokyo (JP)

(*) Notice: Subject to any disclaimer, the term of this patent is extended or adjusted under 35 U.S.C. 154(b) by 192 days.

(21) Appl. No.: 16/914,665

(22) Filed: Jun. 29, 2020

(65) Prior Publication Data

US 2021/0006177 A1 Jan. 7, 2021

(30) Foreign Application Priority Data

Jul. 1, 2019 (JP) .............................. JP2019-122830

(51) Int. Cl.
*H02M 7/00* (2006.01)

(52) U.S. Cl.
CPC .................................. *H02M 7/003* (2013.01)

(58) Field of Classification Search
CPC .................................................... H02M 7/003
See application file for complete search history.

(56) References Cited

U.S. PATENT DOCUMENTS

| 6,629,854 | B2* | 10/2003 | Murakami | ............... | H02B 1/20 |
| | | | | | 439/212 |
| 2002/0034087 | A1* | 3/2002 | Suzuki | .................. | H02M 7/003 |
| | | | | | 363/144 |
| 2008/0186751 | A1* | 8/2008 | Tokuyama | ............. | H05K 7/209 |
| | | | | | 363/141 |
| 2010/0327654 | A1* | 12/2010 | Azuma | ................ | H05K 7/1432 |
| | | | | | 307/9.1 |
| 2011/0181105 | A1* | 7/2011 | Michinaka | ............ | H01L 25/162 |
| | | | | | 307/9.1 |
| 2019/0305687 | A1* | 10/2019 | Uneme | ................. | H02M 7/003 |

FOREIGN PATENT DOCUMENTS

| JP | 2002-034135 | 1/2002 |
| JP | 2004-194382 | 7/2004 |
| JP | 2007-242860 | 9/2007 |
| JP | 2012-235081 | 11/2012 |

OTHER PUBLICATIONS

Japanese Office Action for Japanese Patent Application No. 2019-122830 dated Mar. 15, 2022.

\* cited by examiner

*Primary Examiner* — Kyle J Moody
(74) *Attorney, Agent, or Firm* — Amin, Turocy & Watson, LLP

(57) ABSTRACT

A power conversion apparatus includes a power module, a capacitor unit 23, and a first connection portion 80a. The first connection portion 80a connects a first power conversion circuit portion 31 of the power module and the capacitor unit 23 to each other. The first connection portion 80a includes a first positive electrode bus bar extending portion 83 and a second positive electrode bus bar extending portion 93 which extend along a first module case 61 and a first positive electrode bus bar stretching portion 85 and a second positive electrode bus bar stretching portion 95 which extend in a Z axis direction. The first connection portion 80a includes a first negative electrode bus bar extending portion 84 and a second negative electrode bus bar extending portion 94 which extend along the first module case 61 and a first negative electrode bus bar stretching portion 86 and a second negative electrode bus bar stretching portion 96 which extend in the Z axis direction.

10 Claims, 14 Drawing Sheets

POWER CONVERSION APPARATUS

CROSS-REFERENCE TO RELATED APPLICATION

Priority is claimed on Japanese Patent Application No. 2019-122830, filed Jul. 1, 2019, the content of which is incorporated herein by reference.

BACKGROUND OF THE INVENTION

Field of the Invention

The present invention relates to a power conversion apparatus.

Description of Related Art

In the related art, a semiconductor device including a plurality of semiconductor modules which are disposed in a manner of being stacked in a predetermined direction is known (for example, refer to Japanese Unexamined Patent Application, First Publication No. 2012-235081). Each of the semiconductor modules of this semiconductor device includes two semiconductor elements and three bus bars (two bus bars for power supply connection terminals and a bus bar for an output terminal) drawn out in a direction parallel to each surface of the two semiconductor elements.

SUMMARY OF THE INVENTION

Incidentally, in the semiconductor device according to the foregoing technology in the related art, when the bus bars (a positive electrode-side bus bar and a negative electrode-side bus bar) for power supply connection terminals in each of the semiconductor modules are connected to a capacitor and a power supply provided outside, a circuit constituted of a capacitor and a semiconductor element is formed. In this circuit, it is desirable to decrease a surge voltage accompanying switching operation of the semiconductor element by reducing stray inductance.

However, when a plurality of positive electrode-side bus bars and negative electrode-side bus bars are drawn out of a device in a state of being arranged in a predetermined direction as in the semiconductor device of the foregoing technology in the related art, there is a problem that wiring necessary to reduce stray inductance may become complicated and a larger space may be necessary for electrical connection. In addition, when a plurality of positive electrode-side bus bars and negative electrode-side bus bars are connected to each other through welding or the like, there is concern that insulating members of each of the bus bars may deteriorate or be damaged due to heat.

An object of the present invention is to provide a power conversion apparatus capable of curbing increase in space necessary for electrical connection or increase in stray inductance.

A power conversion apparatus according to the present invention employ the following configurations.

(1) A power conversion apparatus (for example, a power conversion apparatus 1 in the embodiment) according to an aspect of the present invention includes a semiconductor module (for example, a power module 21 in the embodiment), a capacitor (for example, a capacitor unit 23 in the embodiment) that is electrically connected to the semiconductor module, and first conductors (for example, each of positive bus bars PI, PV, and 50$p$; a positive electrode bus bar bent portion 81; each of positive electrode bus bar extending portions 83 and 93; each of positive electrode bus bar stretching portions 85 and 95; and a positive electrode bus bar drawing portion 91 in the embodiment) and second conductors (for example, each of negative electrode bus bars NI, NV, and 50$n$; a negative electrode bus bar bent portion 82; each of negative electrode bus bar extending portions 84 and 94; each of negative electrode bus bar stretching portions 86 and 96; and a negative electrode bus bar drawing portion 92 in the embodiment) that connect the semiconductor module and the capacitor to each other and have polarities different from each other. The first conductors include a first part (for example, a first positive electrode bus bar extending portion 83 in the embodiment) which extends in a first direction (for example, an X axis direction or a Y axis direction in the embodiment), a second part (for example, a second positive electrode bus bar extending portion 93 in the embodiment) which extends in a second direction (for example, the Y axis direction or the X axis direction in the embodiment), a first stretching portion (for example, a first positive electrode bus bar stretching portion 85 in the embodiment) which extends in a direction (for example, a positive Z axis direction in the embodiment) away from the first part in a direction intersecting the first direction and the second direction, and a second stretching portion (for example, a second positive electrode bus bar stretching portion 95 in the embodiment) which extends in a direction (for example, a negative Z axis direction in the embodiment) toward the second part from the first stretching portion and is connected to the second part in a direction intersecting the first direction and the second direction. The second conductors include a third part (for example, a first negative electrode bus bar extending portion 84 in the embodiment) which extends in a manner of being relatively shorter than the first part in the first direction in a state of facing the first part, a fourth part (for example, a second negative electrode bus bar extending portion 94 in the embodiment) which extends in the second direction in a state of facing the first part or the second part, a third stretching portion (for example, a first negative electrode bus bar stretching portion 86 in the embodiment) which extends in a direction (for example, the positive Z axis direction in the embodiment) away from the third part in a direction intersecting the first direction and the second direction, and a fourth stretching portion (for example, a second negative electrode bus bar stretching portion 96 in the embodiment) which extends in a direction (for example, the negative Z axis direction in the embodiment) toward the fourth part from the third stretching portion and is connected to the fourth part in a direction intersecting the first direction and the second direction.

(2) In the power conversion apparatus according to the aspect of (1), the first direction and the second direction may be included within the same plane (for example, an X-Z plane in the embodiment).

(3) In the power conversion apparatus according to the aspect of (1) or (2), each of the first stretching portion and the second stretching portion may have a plate-like external shape. A main surface (for example, a surface 85A in the embodiment) of the first stretching portion and a main surface (for example, a surface 95A in the embodiment) of the second stretching portion may face each other.

(4) In the power conversion apparatus according to the aspect of (3), the main surface of each of the first stretching portion and the second stretching portion may be disposed parallel to a direction (for example, a Z axis direction in the embodiment) intersecting a disposition surface (for example, each of mounting surfaces 71C and 71D in the embodiment) of the semiconductor module.

(5) In the power conversion apparatus according to the aspect of (1) or (2), each of the third stretching portion and the fourth stretching portion may have a plate-like external shape. A main surface (for example, a surface 86A in the embodiment) of the third stretching portion and a main surface (for example, a surface 96A in the embodiment) of the fourth stretching portion may face each other.

(6) In the power conversion apparatus according to the aspect of (5), the main surface of each of the third stretching portion and the fourth stretching portion may be disposed parallel to a direction (for example, a Z axis direction in the embodiment) intersecting a disposition surface (for example, each of mounting surfaces 71C and 71D in the embodiment) of the semiconductor module.

(7) In the power conversion apparatus according to the aspect of (1), each of the first conductors and the second conductors may include an insulating material (for example, each of insulating films 81b, 82b, 83b, 84b, 91b, 92b, 93b, and 94b in the embodiment) covering a surface thereof. Each of the first stretching portion and the second stretching portion may include an exposed portion (for example, each of positive electrode bus bar exposed portions 85a and 95a in the embodiment) exposed from the insulating material.

(8) In the power conversion apparatus according to the aspect of (1), each of the first conductors and the second conductors may include an insulating material (for example, each of insulating films 81b, 82b, 83b, 84b, 91b, 92b, 93b, and 94b in the embodiment) covering a surface thereof. Each of the third stretching portion and the fourth stretching portion may include an exposed portion (for example, each of negative electrode bus bar exposed portions 86a and 96a in the embodiment) exposed from the insulating material.

(9) In the power conversion apparatus according to the aspect of (1), the semiconductor module and the capacitor may be disposed away from each other in a direction (for example, the Y axis direction or the X axis direction in the embodiment) orthogonal to the first direction. The first part, the second part, the third part, and the fourth part may be disposed between the semiconductor module and the capacitor.

(10) In the power conversion apparatus according to the aspect of (1), each of the first part, the second part, the third part, and the fourth part may have a plate-like external shape. A main surface (for example, each of the surfaces 83A, 83B, 84A, 84B, 93A, 93B, 94A, and 94B in the embodiment) of each of the first part, the second part, the third part, and the fourth part may be disposed parallel to a direction intersecting a disposition surface of the semiconductor module.

Advantageous Effects of Invention

According to the aspect of (1), in the first conductors and the second conductors constituting combinations of a positive electrode and a negative electrode, the first part and the second part, and the third part and the fourth part face each other and extend in the first direction and the second direction. Accordingly, increase in space necessary to dispose the first conductors and the second conductors can be curbed. In addition, when the directions in which currents thereof flow are directions opposite to each other, increase in stray inductance can be curbed due to interaction of weakening magnetic fluxes thereof.

According to the aspect of (2), in the first part and the second part, and the third part and the fourth part, increase in space necessary for electrical connection and increase in stray inductance can be curbed.

According to the aspect of (3), the main surfaces of the first stretching portion and the second stretching portion in the first conductors face each other. Therefore, the first stretching portion and the second stretching portion can be easily bonded to each other, and increase in space necessary for electrical connection can be curbed. In addition, when the directions in which currents thereof flow are directions opposite to each other, increase in stray inductance can be curbed due to interaction of weakening magnetic fluxes thereof.

According to the aspect of (4), for example, compared to a case or the like in which the main surface of each of the first stretching portion and the second stretching portion is disposed parallel to the disposition surface of the semiconductor module, increase in space necessary for electrical connection in a direction parallel to the disposition surface of the semiconductor module can be curbed.

According to the aspect of (5), the main surfaces of the third stretching portion and the fourth stretching portion in the second conductors face each other. Therefore, the third stretching portion and the fourth stretching portion can be easily bonded to each other, and increase in space necessary for electrical connection can be curbed. In addition, when the directions in which currents thereof flow are directions opposite to each other, increase in stray inductance can be curbed due to interaction of weakening magnetic fluxes thereof.

According to the aspect of (6), for example, compared to a case or the like in which the main surface of each of the third stretching portion and the fourth stretching portion is disposed parallel to the disposition surface of the semiconductor module, increase in space necessary for electrical connection in a direction parallel to the disposition surface of the semiconductor module can be curbed.

According to the aspect of (7), deterioration or damage occurring due to heat in the insulating materials of other parts or the like in the first conductors can be curbed by bonding the exposed portions of the first stretching portion and the second stretching portion to each other through welding or the like.

According to the aspect of (8), deterioration or damage occurring due to heat in the insulating materials of other parts or the like in the second conductors can be curbed by bonding the exposed portions of the third stretching portion and the fourth stretching portion to each other through welding or the like.

According to the aspect of (9), increase in space necessary for electrical connection of each of the first conductors and the second conductors between the semiconductor module and the capacitor can be curbed.

According to the aspect of (10), each of the main surfaces of the first part and the second part and each of the main surfaces of the third part and the fourth part face each other. Therefore, increase in stray inductance can be curbed. In addition, for example, compared to a case or the like in which the main surface of each of the parts is disposed parallel to the disposition surface of the semiconductor module, increase in space necessary for electrical connection in a direction parallel to the disposition surface of the semiconductor module can be curbed.

DETAILED DESCRIPTION OF THE INVENTION

Hereinafter, an embodiment of a power conversion apparatus of the present invention will be described with reference to the accompanying drawings.

For example, the power conversion apparatus according to the present embodiment is mounted in an electrically driven vehicle or the like. An electrically driven vehicle is an electric car, a hybrid vehicle, a fuel battery vehicle, or the like. An electric car is driven using a battery as a power source. A hybrid vehicle is driven using a battery and an internal-combustion engine as a power source. A fuel battery vehicle is driven using a fuel battery as a power source.

Figure 1:
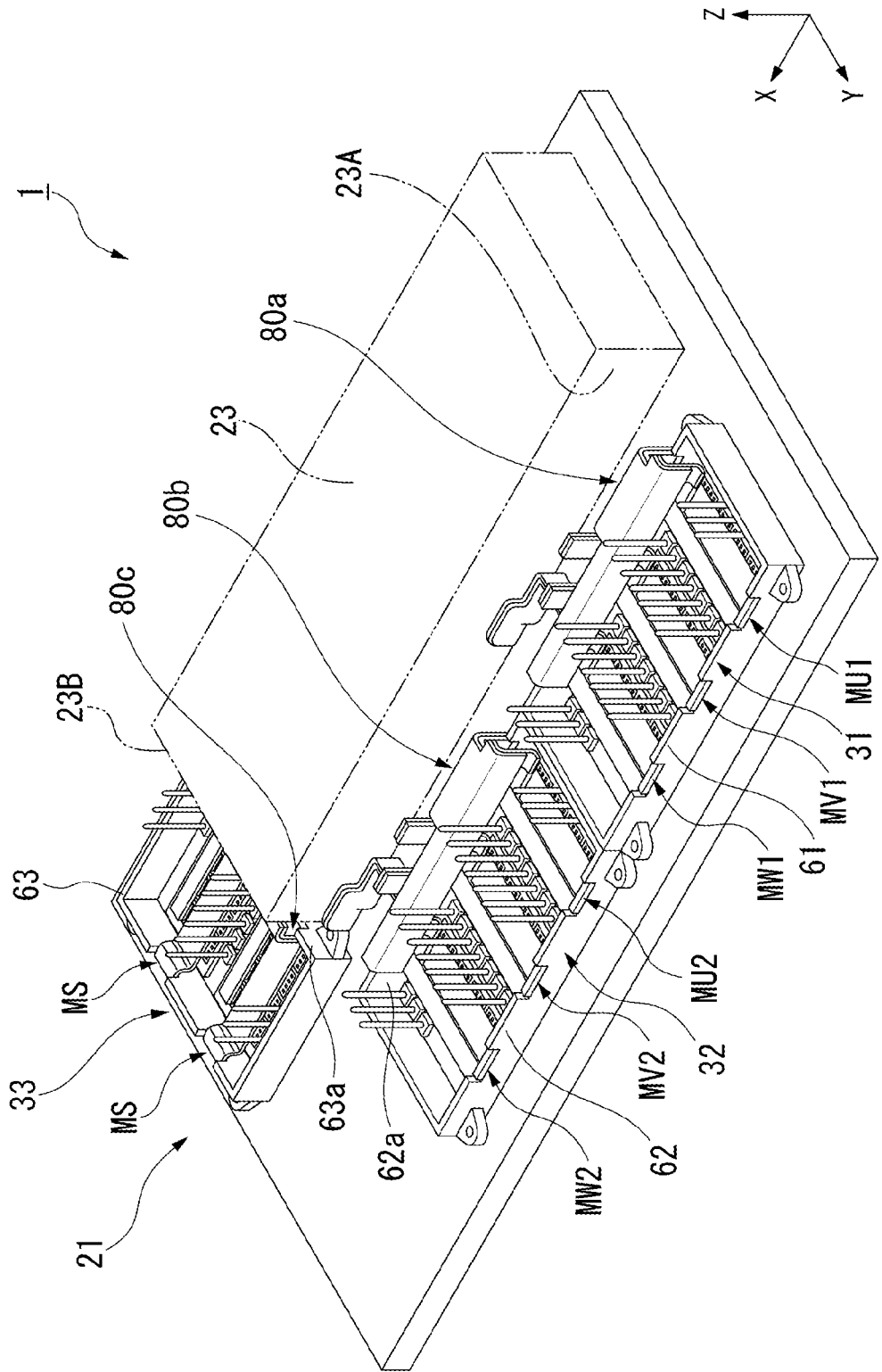
FIG. 1 is a perspective view schematically showing a configuration of a power conversion apparatus of an embodiment of the present invention.
Figure 2:
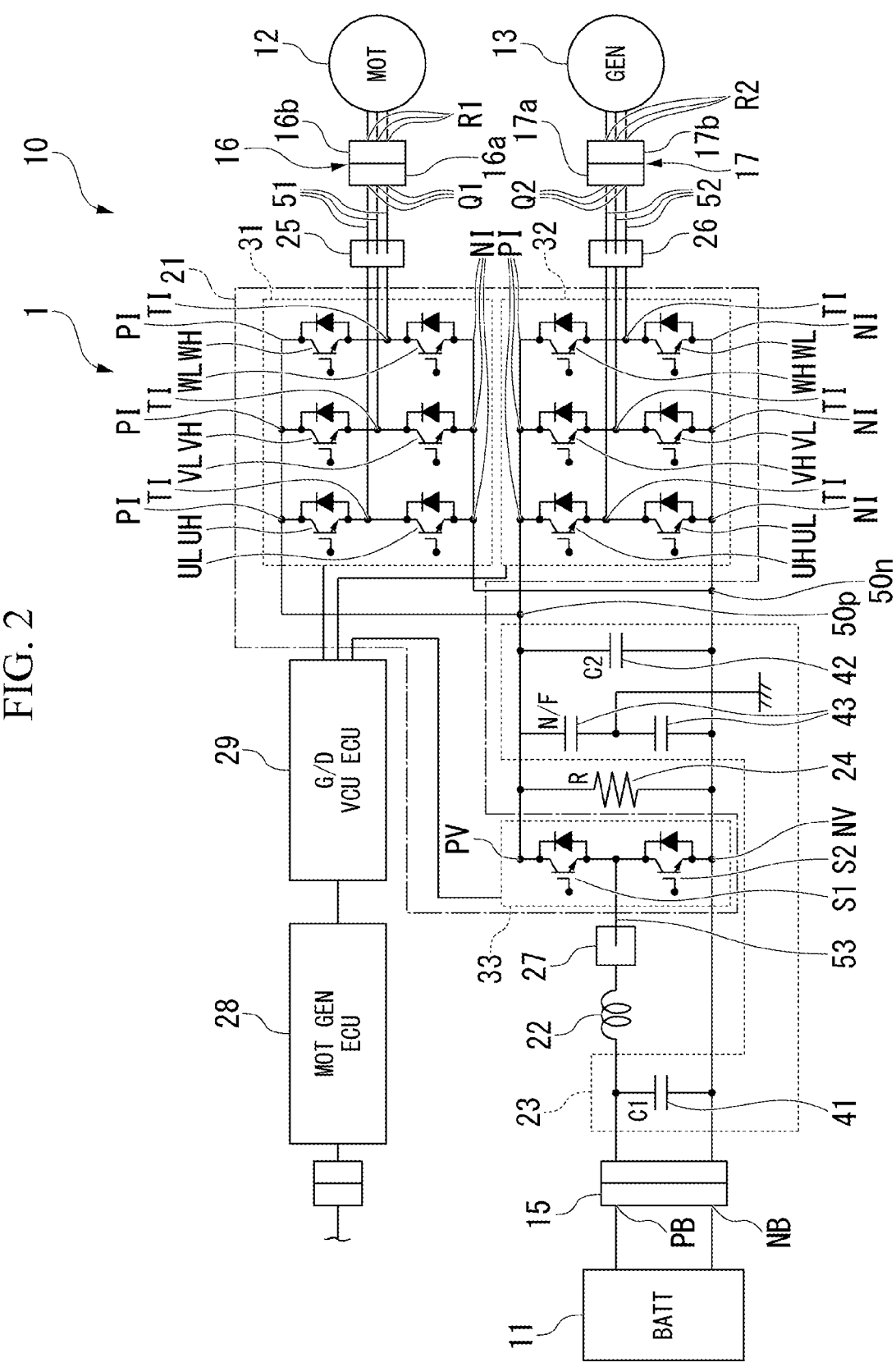
FIG. 2 is a view showing a configuration of a part of a vehicle in which the power conversion apparatus of the embodiment of the present invention is mounted.
Figure 3:
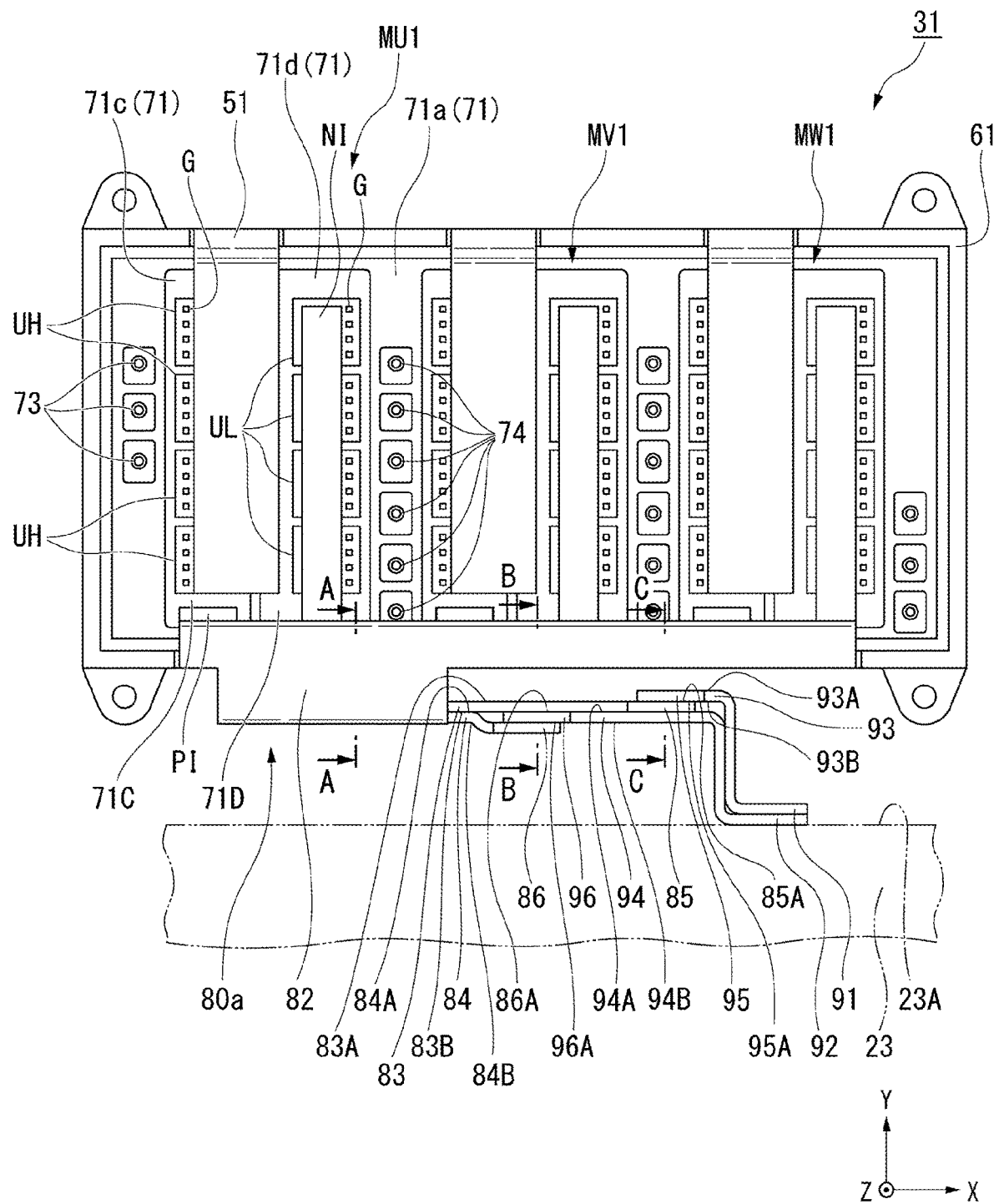
FIG. 3 is a view schematically showing a configuration of a first power conversion circuit portion of a power module in the power conversion apparatus of the embodiment of the present invention in a Z axis direction.

FIG. 1 is a perspective view schematically showing a configuration of a power conversion apparatus 1 of the embodiment of the present invention. FIG. 2 is a view showing a configuration of a part of a vehicle 10 in which the power conversion apparatus 1 according to the embodiment of the present invention is mounted. FIG. 3 is a view schematically showing a configuration of a first power conversion circuit portion 31 of a power module 21 in the power conversion apparatus 1 of the embodiment of the present invention in a Z axis direction.

<Vehicle>

As shown in FIG. 2, in addition to the power conversion apparatus 1, the vehicle 10 includes a battery 11 (BATT), a first motor 12 (MOT) for traveling driving, and a second motor 13 (GEN) for power generation.

For example, the battery 11 is a high-voltage battery serving as a power source for the vehicle 10. The battery 11 includes a battery case and a plurality of battery modules accommodated inside the battery case. The battery modules include a plurality of battery cells connected in series. The battery 11 includes a positive electrode terminal PB and a negative electrode terminal NB connected to a DC connector 15. The positive electrode terminal PB and the negative electrode terminal NB are connected to positive electrode ends and negative electrode ends of the plurality of battery modules connected in series inside the battery case. The battery 11 is connected to the power conversion apparatus 1 via the DC connector 15.

The first motor 12 generates a rotary driving force (power running operation) using power supplied from the battery 11. The second motor 13 generates generation power using a rotary driving force input to a rotary shaft. The second motor 13 may be constituted such that rotary power of an internal-combustion engine can be transmitted. For example, each of the first motor 12 and the second motor 13 is a three-phase AC brushless DC motor. Three phases are constituted of a U phase, a V phase, and a W phase.

Each of the first motor 12 and the second motor 13 is an inner rotor-type motor. Each of the motors 12 and 13 individually includes a rotor which has a permanent magnet for a magnetic field and a stator which has three-phase stator windings for generating a rotating magnetic field for rotating the rotor.

The three-phase stator windings of the first motor 12 are connected to a first three-phase connector 16. The first three-phase connector 16 includes a first device-side connector 16a which is connected to the power conversion apparatus 1 and a first motor-side connector 16b which is connected to an input/output portion R1 of the stator windings of the first motor 12. The three-phase stator windings of the first motor 12 are connected to the power conversion apparatus 1 via the first three-phase connector 16.

The three-phase stator windings of the second motor 13 are connected to a second three-phase connector 17.

The second three-phase connector 17 includes a second device-side connector 17a which is connected to the power conversion apparatus 1 and a second motor-side connector 17b which is connected to an input/output portion R2 of the stator windings of the second motor 13. The three-phase stator windings of the second motor 13 are connected to the power conversion apparatus 1 via the second three-phase connector 17.

<Power Conversion Apparatus>

The power conversion apparatus 1 includes the power module 21, a reactor 22, a capacitor unit 23, a resistor 24, a first current sensor 25, a second current sensor 26, a third current sensor 27, an electronic control unit 28 (MOT GEN ECU), and a gate drive unit 29 (G/D VCU ECU).

The power module 21 includes the first power conversion circuit portion 31, a second power conversion circuit portion 32, and a third power conversion circuit portion 33. The first power conversion circuit portion 31 is connected to the three-phase stator windings of the first motor 12 through the first three-phase connector 16. The first power conversion circuit portion 31 converts DC power input from the battery 11 via the third power conversion circuit portion 33 into three-phase AC power. The second power conversion circuit portion 32 is connected to the three-phase stator windings of the second motor 13 through the second three-phase connector 17. The second power conversion circuit portion 32 converts three-phase AC power input from the second motor 13 into DC power. DC power converted by the second power conversion circuit portion 32 can be supplied to at least one of the battery 11 and the first power conversion circuit portion 31.

Each of the first power conversion circuit portion 31 and the second power conversion circuit portion 32 includes a bridge circuit constituted of a plurality of switching elements in bridge-connection. For example, the switching elements are transistors such as insulated gate bipolar transistors (IGBTs) or metal oxide semiconductor field effect transistors (MOSFETs). For example, in the bridge circuit, U phase transistors UH and UL of a high-side arm and a low-side arm constituting pairs, V phase transistors VH and VL of the high-side arm and the low-side arm constituting pairs, and W phase transistors WH and WL of the high-side arm and the low-side arm constituting pairs are in bridge-connection, respectively.

The bridge circuit includes diodes which are connected to be in a forward direction from emitters to collectors between the collectors and the emitters of the respective transistors UH, UL, VH, VL, WH, and WL.

In each of the transistors UH, VH, and WH of the high-side arm, the collector is connected to a positive electrode bus bar PI and constitutes the high-side arm. Each of the positive bus bars PI of the high-side arm in each phase is connected to a positive electrode bus bar 50p of the capacitor unit 23.

In each of the transistors UL, VL, and WL of the low-side arm, the emitter is connected to a negative electrode bus bar NI and constitutes the low-side arm. Each of the negative electrode bus bars NI of the low-side arm in each phase is connected to a negative electrode bus bar 50n of the capacitor unit 23.

Regarding connection between the positive bus bars PI and 50p and connection between the negative electrode bus bars NI and 50n, as will be described below, connection through laser welding is employed to realize a smaller size than that in bolt fastening and to curb thermal damage to insulating parts.

In each phase, the emitter of each of the transistors UH, VH, and WH of the high-side arm is connected to the collector of each of the transistors UL, VL, and WL of the low-side arm at a connection point TI.

A first input/output terminal Q1 of a first bus bar 51 forming the connection point TI in each phase of the first power conversion circuit portion 31 is connected to the first three-phase connector 16. The connection points TI of the respective phases of the first power conversion circuit portion 31 are connected to the stator windings of the respective phases of the first motor 12 via the first bus bar 51, the first input/output terminal Q1, and the first three-phase connector 16.

A second input/output terminal Q2 of a second bus bar 52 forming the connection point TI in each phase of the second power conversion circuit portion 32 is connected to the second three-phase connector 17. The connection points TI of the respective phases of the second power conversion circuit portion 32 are connected to the stator windings of the respective phases of the second motor 13 via the second bus bar 52, the second input/output terminal Q2, and the second three-phase connector 17.

Each of the first power conversion circuit portion 31 and the second power conversion circuit portion 32 switches between ON (conducting state)/OFF (cutoff state) of the transistor pairs of each phase on the basis of a gate signal which is a switching command input to a gate of each of the transistors UH, VH, WH, UL, VL, and WL from the gate drive unit 29.

The first power conversion circuit portion 31 electrifies the three-phase stator windings with an AC U phase current, an AC V phase current, and an AC W phase current by converting DC power input from the battery 11 via the third power conversion circuit portion 33 into three-phase AC power and sequentially commutating electrification to the three-phase stator windings of the first motor 12.

The second power conversion circuit portion 32 converts three-phase AC power output from the three-phase stator windings of the second motor 13 into DC power through ON (conducting state)/OFF (cutoff state) driving of the transistor pairs of each phase synchronized with rotation of the second motor 13. DC power converted from three-phase AC power by the second power conversion circuit portion 32 can be supplied to the battery 11 via the third power conversion circuit portion 33.

The third power conversion circuit portion 33 is a voltage control unit (VCU). The third power conversion circuit portion 33 includes the switching elements of the high-side arm and the low-side arm constituting a pair. For example, the third power conversion circuit portion 33 includes a first transistor S1 of the high-side arm and a second transistor S2 of the low-side arm. The third power conversion circuit portion 33 includes diodes which are connected to be in the forward direction from emitters to collectors between the collectors and the emitters of the respective first transistor S1 and the second transistor S2.

In the first transistor S1, the collector is connected to a positive electrode bus bar PV, thereby constituting the high-side arm. The positive electrode bus bar PV of the high-side arm is connected to the positive electrode bus bar 50p of the capacitor unit 23.

In the second transistor S2, the emitter is connected to a negative electrode bus bar NV, thereby constituting the low-side arm. The negative electrode bus bar NV of the low-side arm is connected to the negative electrode bus bar 50n of the capacitor unit 23. The negative electrode bus bar 50n of the capacitor unit 23 is connected to the negative electrode terminal NB of the battery 11.

Regarding connection between the positive bus bars PV and 50p and connection between the negative electrode bus bars NV and 50n, connection through laser welding or the like is employed to realize a smaller size than that in bolt fastening and to curb thermal damage to the insulating parts.

The emitter of the first transistor S1 of the high-side arm is connected to the collector of the second transistor S2 of the low-side arm. A connection point between the emitter of the first transistor S1 and the collector of the second transistor S2 is formed by a third bus bar 53. The third bus bar 53 is connected to the positive electrode terminal PB of the battery 11 via the reactor 22.

Both ends of the reactor 22 are respectively connected to the third bus bar 53 constituting the connection point between the first transistor S1 and the second transistor S2 and the positive electrode terminal PB of the battery 11. The reactor 22 includes a coil and a temperature sensor for detecting the temperature of the coil. The temperature sensor is connected to the electronic control unit 28 through a signal line.

The third power conversion circuit portion 33 switches between ON (conducting state)/OFF (cutoff state) of the transistor pairs on the basis of a gate signal which is a switching command input to a gate of each of the first transistor S1 and the second transistor S2 from the gate drive unit 29.

The third power conversion circuit portion 33 alternately switches at the time of boosting between a first state in which the second transistor S2 is set to ON (conducting state) and the first transistor S1 is set to OFF (cutoff state) and a second state in which the second transistor S2 is set to OFF (cutoff state) and the first transistor S1 is set to ON (conducting state).

In the first state, a current flows sequentially to the positive electrode terminal PB of the battery 11, the reactor 22, the second transistor S2, and the negative electrode terminal NB of the battery 11. Then, the reactor 22 is subjected to DC excitation, and magnetic energy is accumulated.

In the second state, an electromotive voltage (induced voltage) is generated between both ends of the reactor 22 so as to hinder a change in magnetic flux caused when a current flowing in the reactor 22 is cut off. An induced voltage caused by magnetic energy accumulated in the reactor 22 is superimposed on a battery voltage, and a boosting voltage higher than an inter-terminal voltage of the battery 11 is applied to a part between the positive electrode bus bar PV and the negative electrode bus bar NV of the third power conversion circuit portion 33.

The third power conversion circuit portion 33 alternately switches between the second state and the first state at the time of regeneration.

In the second state, a current flows sequentially to the positive electrode bus bar PV of the third power conversion circuit portion 33, the first transistor S1, the reactor 22, and the positive electrode terminal PB of the battery 11. Then, the reactor 22 is subjected to DC excitation, and magnetic energy is accumulated.

In the first state, an electromotive voltage (induced voltage) is generated between both ends of the reactor 22 so as to hinder a change in magnetic flux caused when a current flowing in the reactor 22 is cut off. An induced voltage caused by magnetic energy accumulated in the reactor 22 is stepped down, and a stepping-down voltage lower than a voltage between the positive electrode bus bar PV and the negative electrode bus bar NV of the third power conversion circuit portion 33 is applied to a part between the positive electrode terminal PB and the negative electrode terminal NB of the battery 11.

The capacitor unit 23 includes a first smoothing capacitor 41, a second smoothing capacitor 42, and a noise filter 43.

The first smoothing capacitor 41 is connected to a part between the positive electrode terminal PB and the negative electrode terminal NB of the battery 11. The first smoothing capacitor 41 smooths a voltage fluctuation occurring in accordance with an ON/OFF switching operation of the first transistor S1 and the second transistor S2 at the time of regeneration of the third power conversion circuit portion 33.

The second smoothing capacitor 42 is connected to parts between the positive electrode bus bar PI and the negative electrode bus bar NI of the first power conversion circuit portion 31 and the second power conversion circuit portion 32 and between the positive electrode bus bar PV and the negative electrode bus bar NV of the third power conversion circuit portion 33. The second smoothing capacitor 42 is connected to a plurality of positive bus bars PI and negative electrode bus bars NI and the positive electrode bus bar PV and the negative electrode bus bar NV via the positive electrode bus bar 50$p$ and the negative electrode bus bar 50$n$. The second smoothing capacitor 42 smooths a voltage fluctuation occurring in accordance with an ON/OFF switching operation of each of the transistors UH, UL, VH, VL, WH, and WL of each of the first power conversion circuit portion 31 and the second power conversion circuit portion 32. The second smoothing capacitor 42 smooths a voltage fluctuation occurring in accordance with an ON/OFF switching operation of the first transistor S1 and the second transistor S2 at the time of boosting of the third power conversion circuit portion 33.

The noise filter 43 is connected to parts between the positive electrode bus bar PI and the negative electrode bus bar NI of each of the first power conversion circuit portion 31 and the second power conversion circuit portion 32 and between the positive electrode bus bar PV and the negative electrode bus bar NV of the third power conversion circuit portion 33. The noise filter 43 includes two capacitors connected in series. The connection point between the two capacitors is connected to a body ground or the like of the vehicle 10.

The resistor 24 is connected to parts between the positive electrode bus bar PI and the negative electrode bus bar NI of each of the first power conversion circuit portion 31 and the second power conversion circuit portion 32 and between the positive electrode bus bar PV and the negative electrode bus bar NV of the third power conversion circuit portion 33.

The first current sensor 25 is disposed in the first bus bar 51 constituting the connection points TI of the respective phases of the first power conversion circuit portion 31 and having the first input/output terminal Q1 and detects a current of each of the U phase, the V phase, and the W phase.

The second current sensor 26 is disposed in the second bus bar 52 constituting the connection points TI of the respective phases of the second power conversion circuit portion 32 and having the second input/output terminal Q2 and detects a current of each of the U phase, the V phase, and the W phase.

The third current sensor 27 is disposed in the third bus bar 53 constituting the connection point between the first transistor S1 and the second transistor S2 and connected to the reactor 22 and detects a current flowing in the reactor 22.

Each of the first current sensor 25, the second current sensor 26, and the third current sensor 27 is connected to the electronic control unit 28 through a signal line.

The electronic control unit 28 controls operation of each of the first motor 12 and the second motor 13. For example, the electronic control unit 28 is a software functioning unit which functions when a predetermined program is executed by a processor such as a central processing unit (CPU). The software functioning unit is an electronic control unit (ECU) including an electronic circuit having a processor such as a CPU, a read only memory (ROM) storing a program, a random access memory (RAM) temporarily storing data, a timer, and the like. At least a part of the electronic control unit 28 may be an integrated circuit such as a large scale integration (LSI).

For example, the electronic control unit 28 executes feedback control or the like of a current using a current detection value of the first current sensor 25 and a current target value according to a torque command value with respect to the first motor 12 and generates a control signal to be input to the gate drive unit 29.

For example, the electronic control unit 28 executes feedback control or the like of a current using a current detection value of the second current sensor 26 and a current target value according to a regeneration command value with respect to the second motor 13 and generates a control signal to be input to the gate drive unit 29.

A control signal is a signal indicating a timing for ON (conducting state)/OFF (cutoff state) driving of each of the transistors UH, VH, WH, UL, VL, and WL of each of the first power conversion circuit portion 31 and the second power conversion circuit portion 32. For example, a control signal is a signal or the like subjected to pulse width modulation.

The gate drive unit 29 generates a gate signal for actual ON (conducting state)/OFF (cutoff state) driving of each of the transistors UH, VH, WH, UL, VL, and WL of each of the first power conversion circuit portion 31 and the second power conversion circuit portion 32 on the basis of a control signal received from the electronic control unit 28. For example, the gate drive unit 29 generates a gate signal by executing amplification, level-shifting, or the like of a control signal.

The gate drive unit 29 generates a gate signal for ON (conducting state)/OFF (cutoff state) driving of each of the first transistor S1 and the second transistor S2 of the third power conversion circuit portion 33.

For example, the gate drive unit 29 generates a gate signal at a duty ratio corresponding to a boosting voltage command at the time of boosting of the third power conversion circuit portion 33 or a step-down voltage command at the time of regeneration of the third power conversion circuit portion 33. For example, a duty ratio is a ratio of an ON time of each of the first transistor S1 and the second transistor S2.

As shown in FIGS. 1 and 3, each of the first, second, and third power conversion circuit portions 31, 32, and 33 of the power module 21 includes an element module formed by the switching elements of the high-side arm and the low-side arm inside each of module cases 61, 62, and 63.

Inside the first module case 61 of the first power conversion circuit portion 31, the U phase transistors UH and UL of the high-side arm and the low-side arm form an element module MU1, the V phase transistors VH and VL of the high-side arm and the low-side arm form an element module MV1, and the W phase transistors WH and WL of the high-side arm and the low-side arm form an element module MW1.

Inside the second module case 62 of the second power conversion circuit portion 32, the U phase transistors UH and UL of the high-side arm and the low-side arm form an element module MU2, the V phase transistors VH and VL of the high-side arm and the low-side arm form an element module MV2, and the W phase transistors WH and WL of the high-side arm and the low-side arm form an element module MW2.

Inside the third module case 63 of the third power conversion circuit portion 33, the first transistor 51 of the high-side arm and the second transistor S2 of the low-side arm form an element module MS.

In the following description, each of axial directions of an X axis, a Y axis, and a Z axis orthogonal to each other in a three-dimensional space is a direction parallel to each of the axes. For example, a thickness direction of each of the element modules MU1, MV1, MW1, MU2, MV2, MW2, and MS is parallel to the Z axis direction. An arrangement direction of the switching elements of the high-side arm and the low-side arm of each of the element modules MU1, MV1, MW1, MU2, MV2, and MW2, for example, a direction in which the U phase transistor UH of the high-side arm and the U phase transistor UL of the low-side arm are disposed side by side is parallel to the X axis direction. The Y axis direction is orthogonal to the Z axis direction and the X axis direction. A direction in which the first transistor S1 of the high-side arm and the second transistor S2 of the low-side arm of the element module MS are disposed side by side is parallel to the Y axis direction.

For example, each of the module cases 61, 62, and 63 is formed to have a rectangular tube-like external shape. For example, the first and second module cases 61 and 62 are disposed side by side in the X axis direction such that they face an end surface 23A of the capacitor unit 23 on a side in a positive Y axis direction. For example, the third module case 63 is disposed such that it faces an end surface 23B of the capacitor unit 23 on a side in a positive X axis direction.

Inside the first and second module cases 61 and 62, each of the element modules Mill, MV1, and MW1 and each of the element modules MU2, MV2, and MW2 are disposed side by side in the X axis direction. Inside the third module case 63, a pair of element modules MS are disposed side by side in the Y axis direction.

Hereinafter, each of the element modules MU1, MV1, MW1, MU2, MV2, MW2, and MS will be described in detail. For example, each of the element modules MU1, MV1, MW1, MU2, MV2, MW2, and MS has the same configuration. Therefore, as a representative example, a configuration of the element module MU1 constituted of the U phase transistor UH of the high-side arm and the U phase transistor UL of the low-side arm of the U phase of the first power conversion circuit portion 31 will be described.

For example, the element module MU1 includes the U phase transistors UH and UL of the high-side arm and the low-side arm, an insulating substrate 71, a conductive spacer 72, the positive electrode bus bar PI and the negative electrode bus bar NI, the first bus bar 51, a first signal terminal 73, and a second signal terminal 74.

For example, the U phase transistors UH and UL of the high-side arm and the low-side arm are mounted in the insulating substrate 71 and are fixed to a resin molded body (not shown) formed through mold-shaping using an electrically insulating resin material. The resin molded body fixes all the constituent components of the element module MU1 with a resin material.

The insulating substrate 71 includes an electrically insulating substrate and conductors which are provided on both surfaces of the substrate. For example, the insulating substrate 71 is a direct copper bonding (DCB) substrate. The DCB substrate includes a ceramic substrate 71a; and a first copper plate 71b, a second copper plate 71c, and a third copper plate 71d which are provided on both surfaces of the ceramic substrate 71a in the thickness direction. The first copper plate 71b, the second copper plate 71c, and the third copper plate 71d sandwich the ceramic substrate 71a from both sides in the thickness direction and are electrically insulated by the ceramic substrate 71a. The second copper plate 71c and the third copper plate 71d are disposed away from each other with a predetermined gap therebetween, thereby being electrically insulated.

The U phase transistors UH and UL of the high-side arm and the low-side arm are disposed side by side in the X axis direction when viewed in the Z axis direction in a state in which the front and the rear thereof are directed in the same direction in the Z axis direction. For example, the U phase transistors UH and UL of the high-side arm and the low-side arm are disposed while having surfaces thereof on the respective collector sides in the Z axis direction toward the insulating substrate 71 side. A surface of the U phase transistor UH of the high-side arm on the collector side faces a mounting surface 71C (surface on a side in the positive Z axis direction) of the second copper plate 71c in the Z axis direction, and a surface of the U phase transistor UL of the low-side arm on the collector side faces a mounting surface 71D (surface on a side in the positive Z axis direction) of the third copper plate 71d in the Z axis direction.

Each of the positive electrode bus bar PI, the negative electrode bus bar NI, and the first bus bar 51 is a conductor formed to have a plate shape, such as a copper plate, for example.

The surface of the U phase transistor UH of the high-side arm on the collector side is electrically bonded to the mounting surface 71C of the second copper plate 71c of the insulating substrate 71 using a conductive bonding material. For example, a bonding material is a solder or the like. The positive electrode bus bar PI is electrically bonded to the mounting surface 71C of the second copper plate 71c using a conductive bonding material. That is, the collector of the U phase transistor UH of the high-side arm and the positive electrode bus bar PI are electrically connected to each other with the second copper plate 71c therebetween.

A surface of the U phase transistor UH of the high-side arm on the emitter side is electrically bonded to the first bus bar 51 with the conductive spacer 72 therebetween. The conductive spacer 72 is a conductor formed to have a plate shape, such as a copper plate, for example. The conductive spacer 72 is disposed between the first bus bar 51 and the U phase transistor UH of the high-side arm in the Z axis direction and is electrically bonded to the first bus bar 51 and the surface of the U phase transistor UH of the high-side arm on the emitter side using a conductive bonding material.

A surface of the U phase transistor UL of the low-side arm on the collector side is electrically bonded to the mounting surface 71D of the third copper plate 71d of the insulating substrate 71 using a conductive bonding material. The first bus bar 51 is electrically bonded to the mounting surface 71D of the third copper plate 71d using a conductive bonding material. That is, the collector of the U phase transistor UL of the low-side arm and the first bus bar 51 are electrically connected to each other with the third copper plate 71d therebetween.

A surface of the U phase transistor UL of the low-side arm on the emitter side is electrically bonded to the negative electrode bus bar NI with the conductive spacer 72 therebetween. The conductive spacer 72 is disposed between the negative electrode bus bar NI and the U phase transistor UL of the low-side arm in the Z axis direction and is electrically bonded to the negative electrode bus bar NI and the surface of the U phase transistor UL of the low-side arm on the emitter side using a conductive bonding material.

Each of signal terminals G of the U phase transistors UH and UL of the high-side arm and the low-side arm is electrically connected to each of the first signal terminal 73 and the second signal terminal 74 through a conductive wire or the like. For example, the signal terminals G is a gate terminal or the like which is a control terminal to which a control signal is input.

For example, each of the first signal terminal 73 and the second signal terminal 74 is formed to have a pin-like external shape extending in the positive Z axis direction. The first signal terminal 73 and the second signal terminal 74 are provided such that they protrude upward from the surface of the insulating substrate 71 and are connected to the gate drive unit 29.

For example, each of the positive electrode bus bar PI and the negative electrode bus bar NI is drawn out to the outside of the first module case 61 toward a side in a negative Y axis direction and is connected to the positive electrode bus bar 50p and the negative electrode bus bar 50n of the capacitor unit 23.

For example, the first bus bar 51 is drawn out to the outside of the first module case 61 toward a side in the positive Y axis direction and is connected to the stator windings of the U phase of the first motor 12 via the first input/output terminal Q1 and the first three-phase connector 16.

Hereinabove, the element module MU1 of the U phase of the first power conversion circuit portion 31 has been described. However, each of the element modules MV1 and MW1 of the V phase and the W phase of the first power conversion circuit portion 31 includes each of the V phase transistors VH and VL or each of the W phase transistors WH and WL in place of each of the U phase transistors UH and UL. Moreover, the element modules MU2, MV2, and MW2 of the respective phases of the second power conversion circuit portion 32 include the second bus bar 52 in place of the first bus bar 51.

In addition, compared to the element module MU1 of the U phase of the first power conversion circuit portion 31, the element module MS of the third power conversion circuit portion 33 includes the first and second transistors 51 and S2 in place of each of the U phase transistors UH and UL, includes the positive electrode bus bar PV and the negative electrode bus bar NV in place of the positive electrode bus bar PI and the negative electrode bus bar NI, and includes the third bus bar 53 in place of the first bus bar 51.

Hereinafter, each of connection portions 80a, 80b, and 80c between each of the positive bus bars PI and PV and each of the negative electrode bus bars NI and NV of the power module 21, and between the positive electrode bus bar 50p and the negative electrode bus bar 50n of the capacitor unit 23 will be described in detail. Each of the connection portions 80a, 80b, and 80c between each of the first, second, and third power conversion circuit portions 31, 32, and 33 of the power module 21 and the capacitor unit 23 has substantially the same configuration, for example. Therefore, as a representative example, a configuration of a first connection portion 80a between the first power conversion circuit portion 31 and the capacitor unit 23 will be described.

Figure 4:
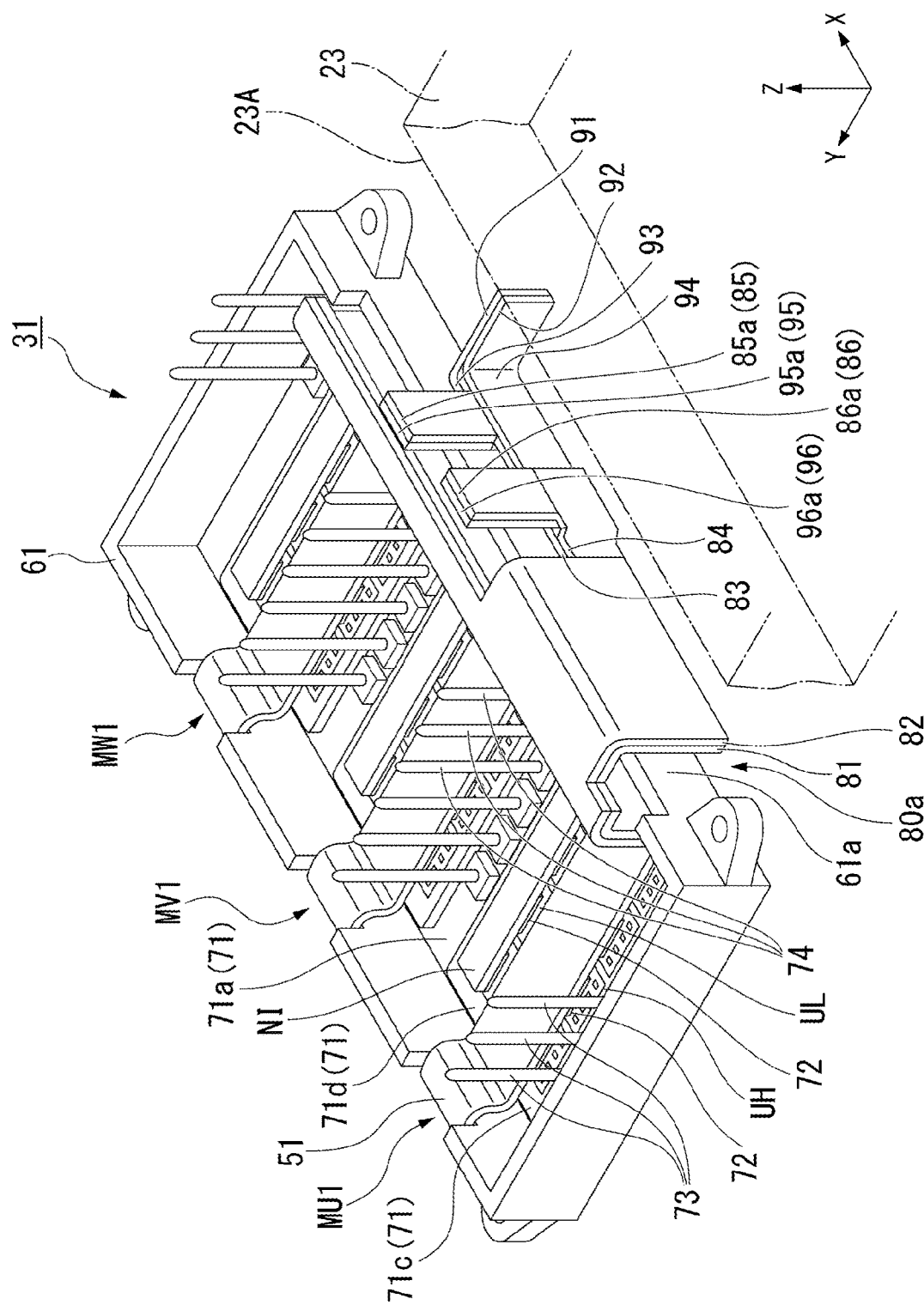
FIG. 4 is a perspective view schematically showing a configuration of a first connection portion between each of positive and negative electrode bus bars of the first power conversion circuit portion of the power module and each of positive and negative electrode bus bars of a capacitor unit in the power conversion apparatus of the embodiment of the present invention.
Figure 5:
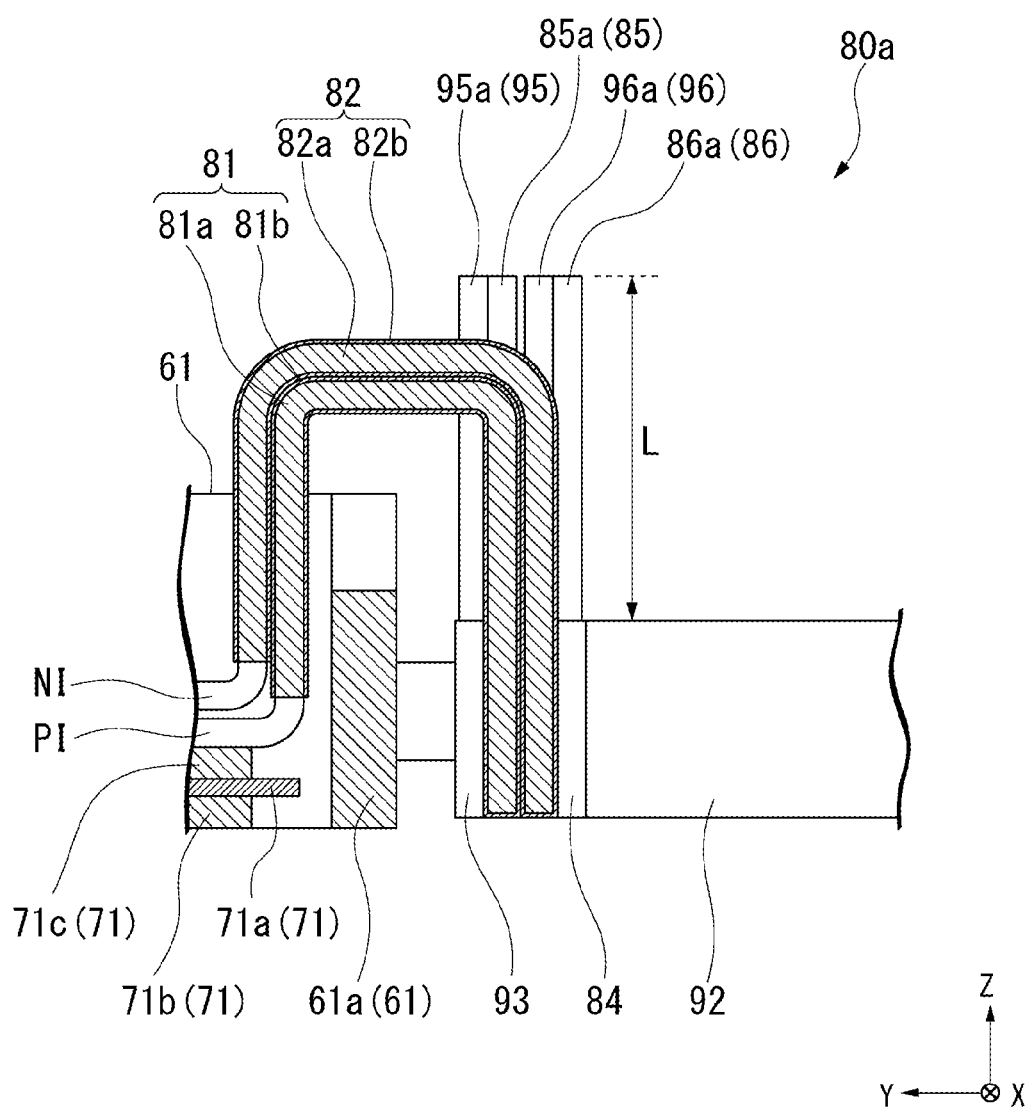
FIG. 5 is a cross-sectional view cut along a Y-Z plane at a position of line A-A shown in FIG. 3.
Figure 6:
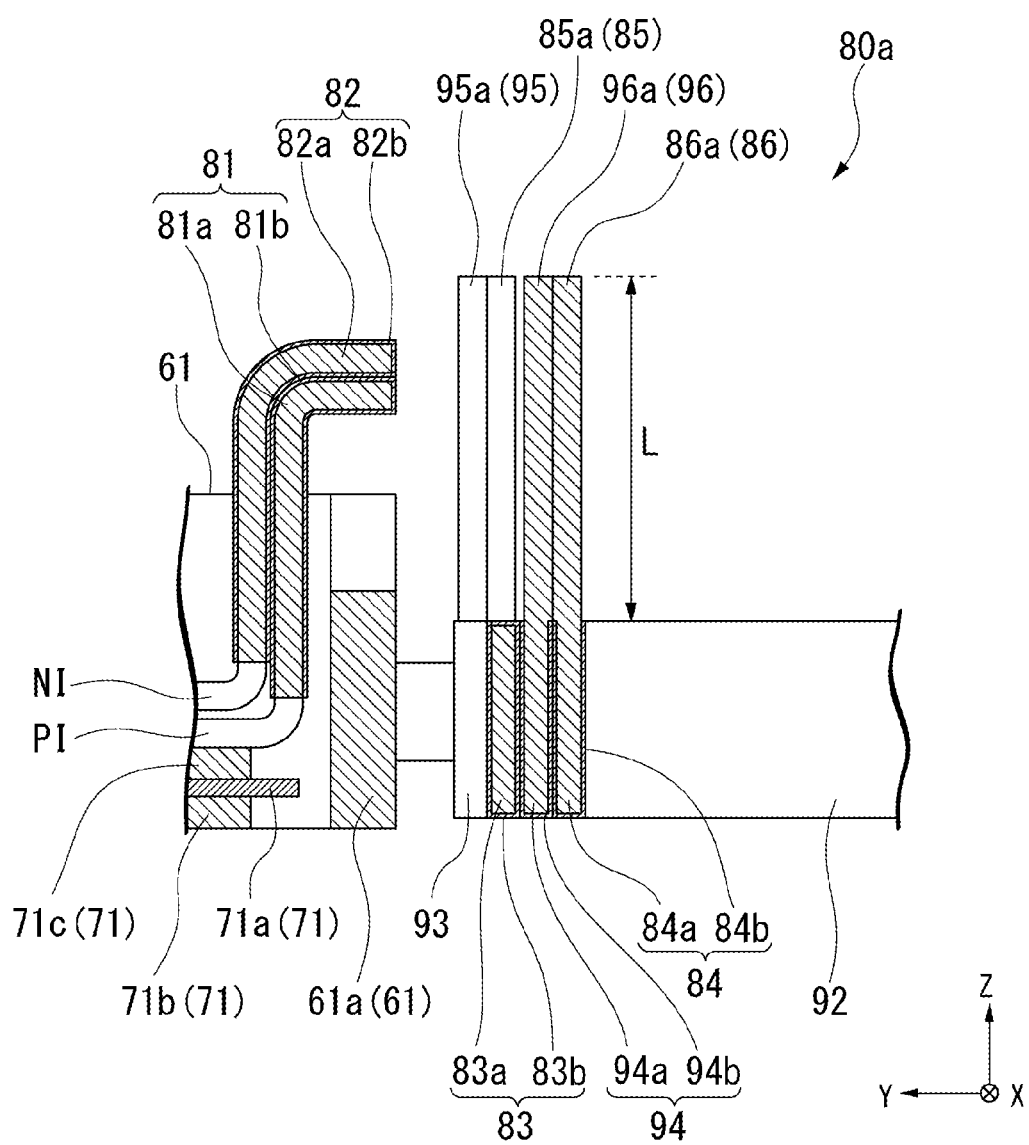
FIG. 6 is a cross-sectional view cut along the Y-Z plane at a position of line B-B shown in FIG. 3.
Figure 7:
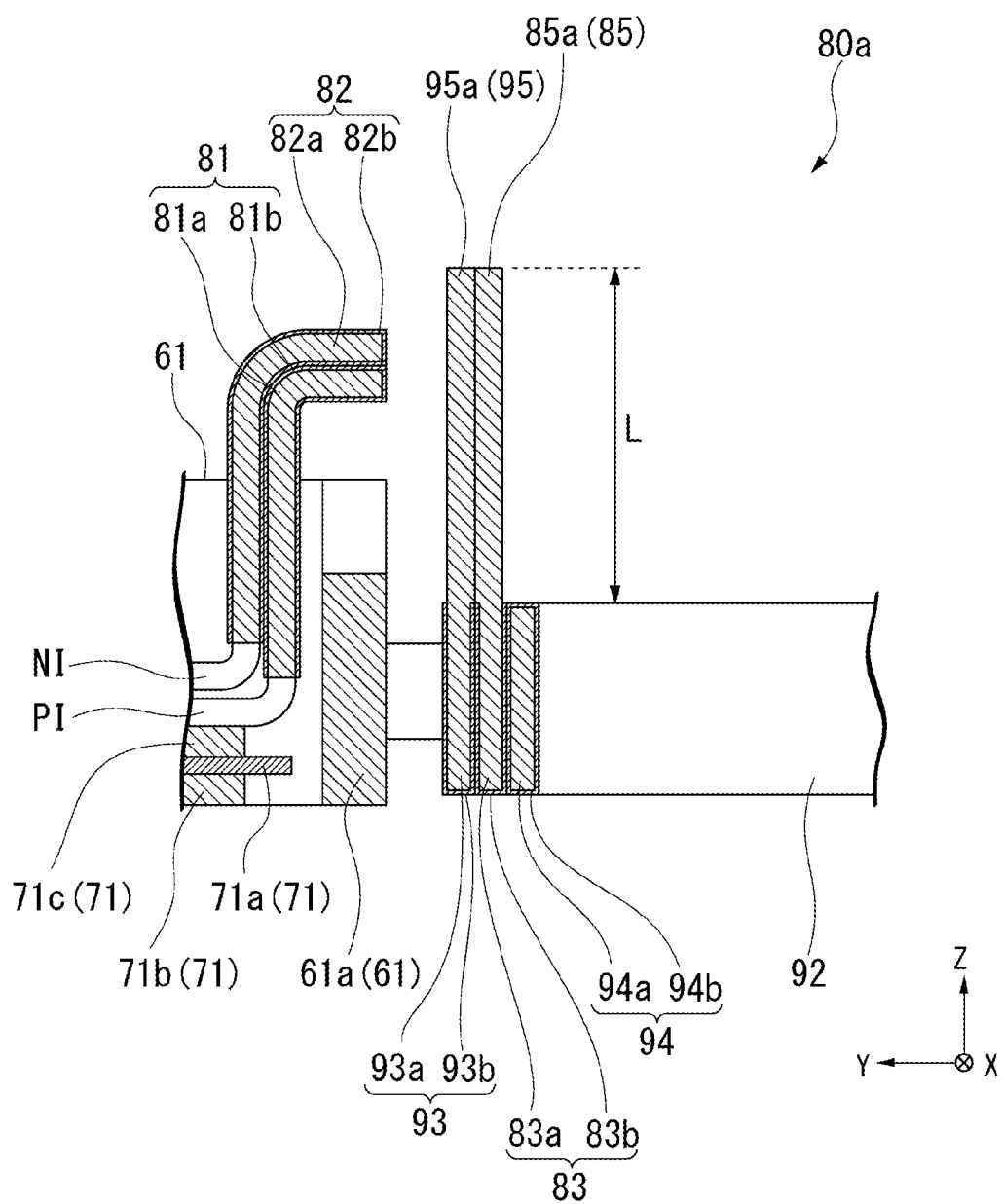
FIG. 7 is a cross-sectional view cut along the Y-Z plane at a position of line C-C shown in FIG. 3.
Figure 8:
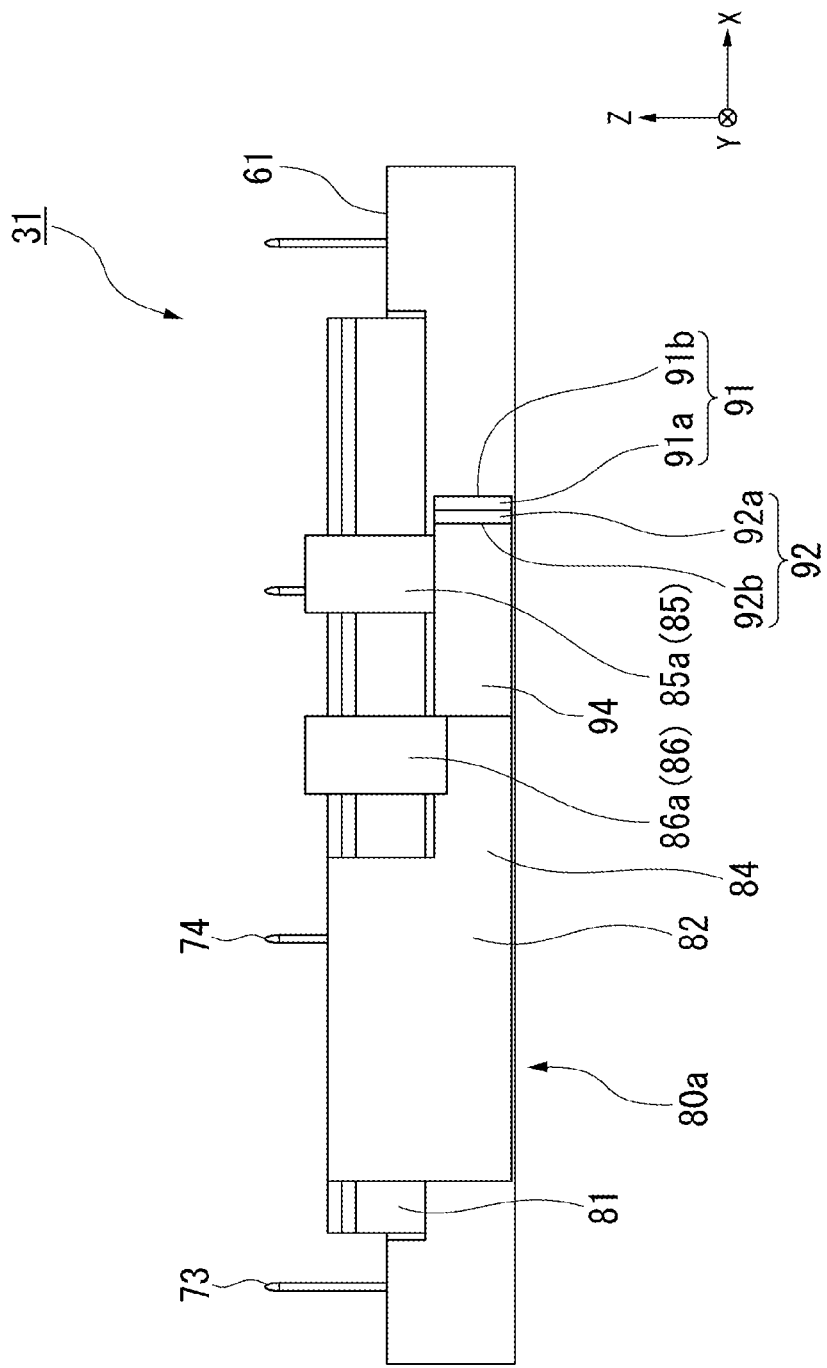
FIG. 8 is a view of the first connection portion between each of the positive and negative electrode bus bars of the first power conversion circuit portion of the power module and each of the positive and negative electrode bus bars of the capacitor unit in the power conversion apparatus of the embodiment of the present invention in a Y axis direction.
Figure 9:
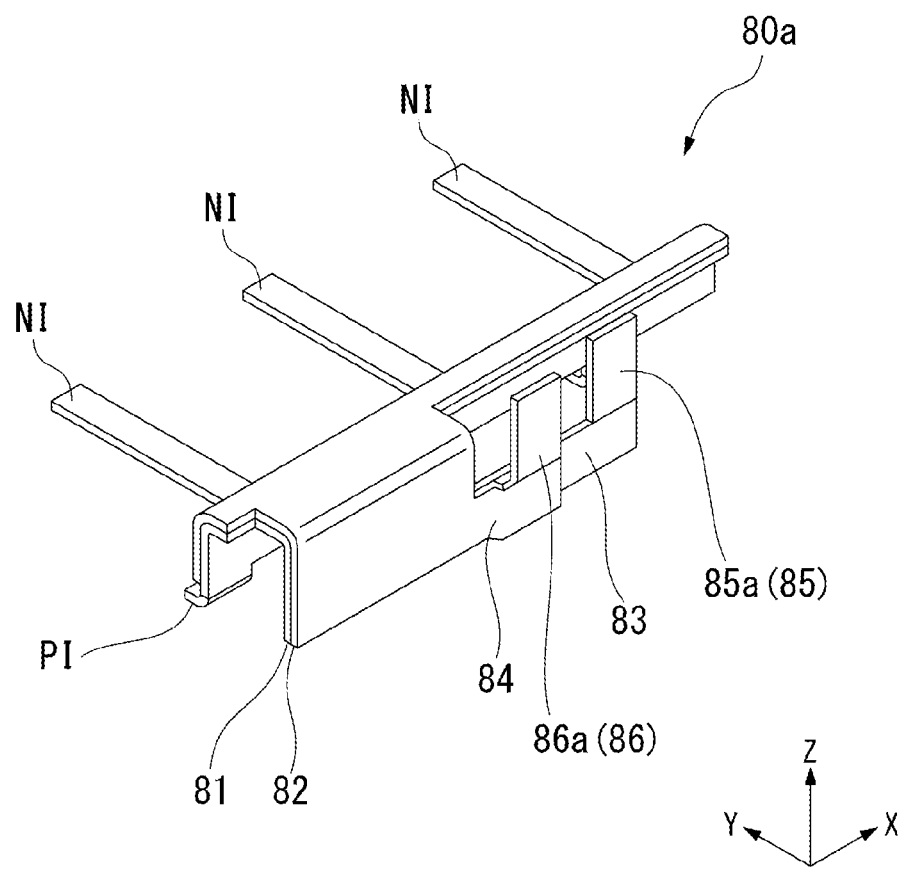
FIG. 9 is a perspective view showing a configuration of the first connection portion on the first power conversion circuit portion side in the power conversion apparatus of the embodiment of the present invention.
Figure 10:
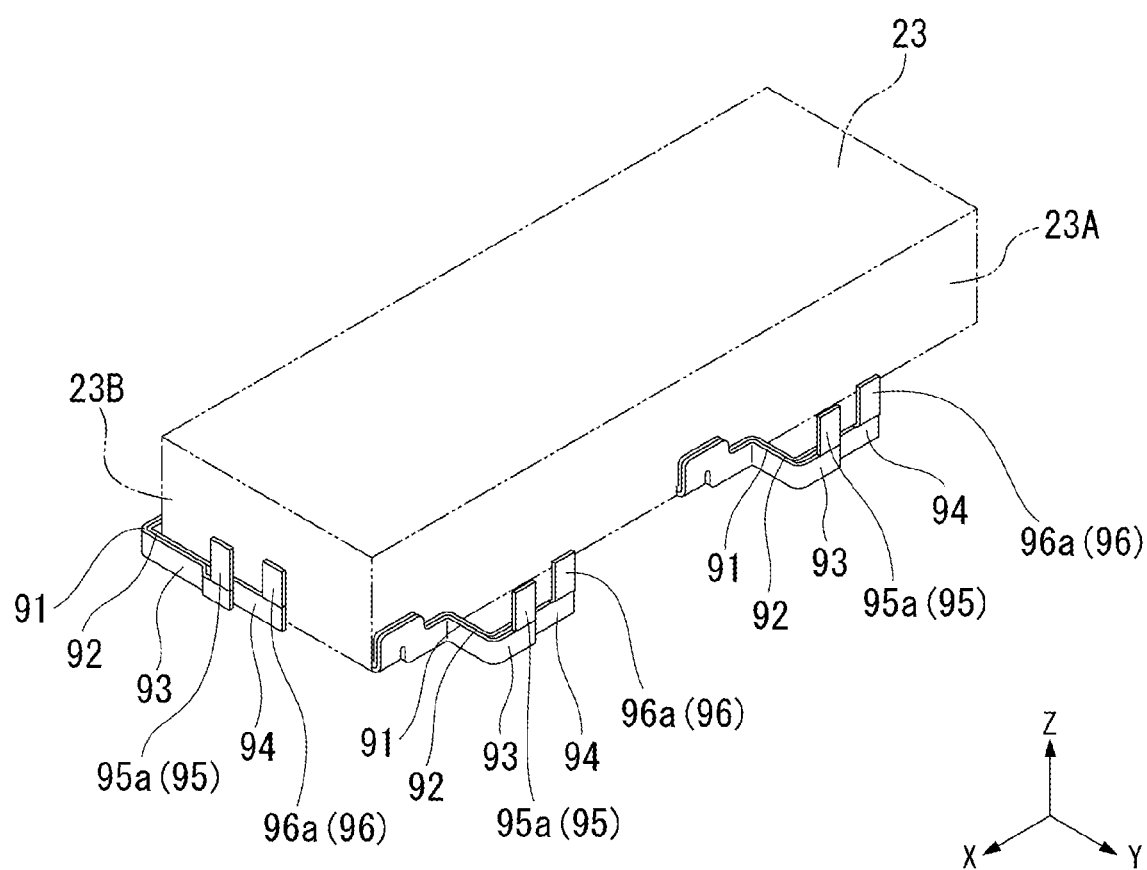
FIG. 10 is a perspective view showing configurations of positive electrode bus bar drawing portions, negative electrode bus bar drawing portions, positive electrode bus bar exposed portions, and negative electrode bus bar exposed portions of the capacitor unit in the power conversion apparatus of the embodiment of the present invention.

FIG. 4 is a perspective view schematically showing a configuration of the first connection portion 80a between each of the positive and negative electrode bus bars PI and NI of the first power conversion circuit portion 31 of the power module 21 and each of the positive and negative electrode bus bars 50*p* and 50*n* of the capacitor unit 23 in the power conversion apparatus 1 of the embodiment of the present invention. FIG. 5 is a cross-sectional view cut along a Y-Z plane at a position of line A-A shown in FIG. 3. FIG. 6 is a cross-sectional view cut along the Y-Z plane at a position of line B-B shown in FIG. 3. FIG. 7 is a cross-sectional view cut along the Y-Z plane at a position of line C-C shown in FIG. 3. FIG. 8 is a view of the first connection portion 80*a* between each of the positive and negative electrode bus bars PI and NI of the first power conversion circuit portion 31 of the power module 21 and each of the positive and negative electrode bus bars 50*p* and 50*n* of the capacitor unit 23 in the power conversion apparatus 1 of the embodiment of the present invention in the Y axis direction. FIG. 9 is a perspective view showing a configuration of the first connection portion 80*a* on the first power conversion circuit portion 31 side in the power conversion apparatus 1 of the embodiment of the present invention. FIG. 10 is a perspective view showing configurations of positive electrode bus bar drawing portions 91, and negative electrode bus bar drawing portions 92, second positive electrode bus bar stretching portions 95, and second negative electrode bus bar stretching portions 96 of the capacitor unit 23 in the power conversion apparatus 1 of the embodiment of the present invention.

As shown in FIGS. 3 to 10, the first connection portion 80*a* includes a positive electrode bus bar bent portion 81, a negative electrode bus bar bent portion 82, a first positive electrode bus bar extending portion 83, a first negative electrode bus bar extending portion 84, a first positive electrode bus bar stretching portion 85, and a first negative electrode bus bar stretching portion 86 on the first power conversion circuit portion 31 side. The first connection portion 80*a* includes the positive electrode bus bar drawing portion 91, the negative electrode bus bar drawing portion 92, a second positive electrode bus bar extending portion 93, a second negative electrode bus bar extending portion 94, the second positive electrode bus bar stretching portion 95, and the second negative electrode bus bar stretching portion 96 on the capacitor unit 23 side.

The positive electrode bus bar bent portion 81 is formed by integrally connecting the positive electrode bus bars PI of the U phase, the V phase, and the W phase of the first power conversion circuit portion 31. The negative electrode bus bar bent portion 82 is formed by integrally connecting the negative electrode bus bars NI of the U phase, the V phase, and the W phase of the first power conversion circuit portion 31. For example, each of the positive electrode bus bar bent portion 81 and the negative electrode bus bar bent portion 82 is formed to have a plate-like external shape bent in a U-shape in a manner of straddling a side wall portion 61*a* on a side in the negative Y axis direction toward the outside from the inside of the first module case 61.

The positive electrode bus bar bent portion 81 includes a conductive bent main body portion 81*a* which is integrally electrically connected to the positive electrode bus bars PI of the U phase, the V phase, and the W phase and an insulating film 81*b* which has electrical insulating properties and with which a surface of the bent main body portion 81*a* is coated.

The negative electrode bus bar bent portion 82 includes a conductive bent main body portion 82*a* which is integrally electrically connected to the negative electrode bus bars NI of the U phase, the V phase, and the W phase and an insulating film 82*b* which has electrical insulating properties and with which a surface of the bent main body portion 82*a* is coated.

The positive electrode bus bar bent portion 81 and the negative electrode bus bar bent portion 82 are disposed such that they are substantially parallel to each other and are stacked in the thickness directions thereof.

The positive electrode bus bar bent portion 81 and the negative electrode bus bar bent portion 82 are disposed such that the directions in which currents thereof flow become directions opposite to each other in stacked parts (overlapping parts) thereof. In accordance with such a relative disposition state of the positive electrode bus bar PI and the negative electrode bus bar NI, magnetic interaction, that is, interaction of weakening magnetic fluxes thereof occurs and stray inductance is reduced.

In addition, in each of the positive electrode bus bar bent portion 81 and the negative electrode bus bar bent portion 82, the directions in which currents thereof flow in a part extending to a side in the positive Z axis direction along the side wall portion 61*a* inside the first module case 61 and a part extending to a side in a negative Z axis direction along the side wall portion 61*a* outside the first module case 61 become directions opposite to each other. In accordance with such a disposition state inside and outside the first module case 61 in each of the positive electrode bus bar PI and the negative electrode bus bar NI, magnetic interaction, that is, interaction of weakening magnetic fluxes thereof occurs and stray inductance is reduced.

For example, each of the first positive electrode bus bar extending portion 83 and the first negative electrode bus bar extending portion 84 is formed to have a plate-like external shape extending in the positive X axis direction in a parallel manner along the side wall portion 61*a* from an end portion of each of the positive electrode bus bar bent portion 81 and the negative electrode bus bar bent portion 82 outside the first module case 61.

A main surface of each of the first positive electrode bus bar extending portion 83 and the first negative electrode bus bar extending portion 84 is disposed parallel to a direction (Z axis direction) orthogonal to each of the mounting surfaces 71C and 71D of each of the element modules MU1, MV1, MW1, MU2, MV2, MW2, and MS. The main surfaces of the extending portions 83 and 84 are surfaces having the largest surface area, that is, surfaces 83A and 83B of the first positive electrode bus bar extending portion 83 on sides in the positive and negative Y axis directions and surfaces 84A and 84B of the first negative electrode bus bar extending portion 84 on sides in the positive and negative Y axis directions, for example.

The first positive electrode bus bar extending portion 83 includes a conductive extending main body portion 83*a* which is integrally electrically connected to the bent main body portion 81*a* of the positive electrode bus bar bent portion 81 and an insulating film 83*b* which has electrical insulating properties and with which a surface of the extending main body portion 83*a* is coated.

The first negative electrode bus bar extending portion 84 includes a conductive extending main body portion 84*a* which is integrally electrically connected to the bent main body portion 82*a* of the negative electrode bus bar bent portion 82 and an insulating film 84*b* which has electrical insulating properties and with which a surface of the extending main body portion 84*a* is coated.

A tip portion (that is, an end portion in the positive X axis direction) of the first negative electrode bus bar extending portion 84 is bent such that a gap for disposing the second negative electrode bus bar extending portion 94 (which will be described below) on the capacitor unit 23 side is provided between the first negative electrode bus bar extending portion 84 and the first positive electrode bus bar extending portion 83 in the thickness direction (that is, the Y axis direction), for example.

The first positive electrode bus bar extending portion 83 and the first negative electrode bus bar extending portion 84 are disposed such that they are substantially parallel to each other and are stacked in the thickness directions thereof. For example, the length of the first positive electrode bus bar extending portion 83 in the X axis direction is formed to be relatively longer than the length of the first negative electrode bus bar extending portion 84 in the X axis direction.

For example, each of the first positive electrode bus bar stretching portion 85 and the first negative electrode bus bar stretching portion 86 is formed to have a plate-like external shape extending in a direction away from the tip portion (that is, the end portion in the positive X axis direction) of each of the first positive electrode bus bar extending portion 83 and the first negative electrode bus bar extending portion 84 outside the first module case 61. For example, the direction in which each of the first positive electrode bus bar stretching portion 85 and the first negative electrode bus bar stretching portion 86 extends is the positive Z axis direction parallel to the side wall portion 61a.

A main surface of each of the first positive electrode bus bar stretching portion 85 and the first negative electrode bus bar stretching portion 86 is disposed parallel to a direction (Z axis direction) orthogonal to each of the mounting surfaces 71C and 71D of each of the element modules MU1, MV1, MW1, MU2, MV2, MW2, and MS. The main surfaces of the stretching portions 85 and 86 are surfaces having the largest surface area, that is, surfaces of the first positive electrode bus bar stretching portion 85 on sides in the positive and negative Y axis directions and surfaces of the first negative electrode bus bar stretching portion 86 on sides in the positive and negative Y axis directions, for example. A surface 85A, of the main surfaces of the first positive electrode bus bar stretching portion 85, on a side in the positive Y axis direction faces a surface 95A of the second positive electrode bus bar stretching portion 95 (which will be described below) on a side in the negative Y axis direction. A surface 86A, of the main surfaces of the first negative electrode bus bar stretching portion 86, on a side in the positive Y axis direction faces a surface 96A of the second negative electrode bus bar stretching portion 96 (which will be described below) on a side in the negative Y axis direction.

The first positive electrode bus bar stretching portion 85 includes a conductive main body portion (not shown) and an insulating film (not shown) having electrical insulating properties, which are integrally connected to each of the conductive extending main body portion 83a and the insulating film 83b having electrical insulating properties of the first positive electrode bus bar extending portion 83. The first positive electrode bus bar stretching portion 85 includes a conductive first positive electrode bus bar exposed portion 85a exposed from the insulating film in a predetermined range (for example, the entire region or the like leading to the tip portion of the first positive electrode bus bar extending portion 83) from the tip portion in the extending direction (that is, the positive Z axis direction).

For example, the length of the first positive electrode bus bar exposed portion 85a in the Z axis direction is formed such that a distance between the tip portion of the first positive electrode bus bar exposed portion 85a and the insulating film 83b of the first positive electrode bus bar extending portion 83 becomes a predetermined distance L or longer. For example, the predetermined distance L is a distance or the like required to curb thermal damage to the insulating film 83b caused by heat generated during welding work of laser welding or the like in the first positive electrode bus bar exposed portion 85a.

The first negative electrode bus bar stretching portion 86 includes a conductive main body portion (not shown) and an insulating film (not shown) having electrical insulating properties, which are integrally connected to each of the conductive extending main body portion 84a and the insulating film 84b having electrical insulating properties of the first negative electrode bus bar extending portion 84. The first negative electrode bus bar stretching portion 86 includes a conductive first negative electrode bus bar exposed portion 86a exposed from the insulating film in a predetermined range (for example, the entire region or like leading to the tip portion of the first negative electrode bus bar extending portion 84) from the tip portion in the extending direction (that is, the positive Z axis direction).

For example, the length of the first negative electrode bus bar exposed portion 86a in the Z axis direction is formed such that a distance between the tip portion of the first negative electrode bus bar exposed portion 86a and the insulating film 84b of the first negative electrode bus bar extending portion 84 becomes the predetermined distance L or longer. For example, the predetermined distance L is a distance or the like required to curb thermal damage to the insulating film 84b caused by heat generated during welding work of laser welding or the like in the first negative electrode bus bar exposed portion 86a.

For example, the first negative electrode bus bar stretching portion 86 is provided with a gap for disposing the second negative electrode bus bar stretching portion 96 (which will be described below) on the capacitor unit 23 side between the first negative electrode bus bar stretching portion 86 and the first positive electrode bus bar extending portion 83 in the thickness direction (that is, the Y axis direction).

For example, the positive electrode bus bar drawing portion 91 and the negative electrode bus bar drawing portion 92 are formed to have a plate-like external shape which is bent along the end surface 23A on a side in the positive Y axis direction from the end portion of the capacitor unit 23 on a side in the negative Z axis direction, is bent in an L-shape when viewed in the Z axis direction to be further away from the end surface 23A in the Y axis direction, and extends in a negative X axis direction.

The positive electrode bus bar drawing portion 91 includes a conductive drawing main body portion 91a which is integrally electrically connected to the positive electrode bus bar 50p of the capacitor unit 23 and an insulating film 91b which has electrical insulating properties and with which a surface of the drawing main body portion 91a is coated.

The negative electrode bus bar drawing portion 92 includes a conductive drawing main body portion 92a which is integrally electrically connected to the negative electrode bus bar 50n of the capacitor unit 23 and an insulating film 92b which has electrical insulating properties and with which a surface of the drawing main body portion 92a is coated.

The positive electrode bus bar drawing portion 91 and the negative electrode bus bar drawing portion 92 are disposed such that they are substantially parallel to each other and are stacked in the thickness directions thereof. For example, the length of the positive electrode bus bar drawing portion 91 in the X axis direction is formed to be shorter than the length of the negative electrode bus bar drawing portion 92 in the X axis direction.

The positive electrode bus bar drawing portion 91 and the negative electrode bus bar drawing portion 92 are disposed such that the directions in which currents thereof flow become directions opposite to each other in stacked parts (overlapping parts) thereof. In accordance with such a relative disposition state of the positive electrode bus bar 50*p* and the negative electrode bus bar 50*n*, magnetic interaction, that is, interaction of weakening magnetic fluxes thereof occurs and stray inductance is reduced.

For example, each of the second positive electrode bus bar extending portion 93 and the second negative electrode bus bar extending portion 94 is formed to have a plate-like external shape extending in the positive X axis direction from the tip portion of each of the positive electrode bus bar drawing portion 91 and the negative electrode bus bar drawing portion 92 between the capacitor unit 23 and the first module case 61. Each of the second positive electrode bus bar extending portion 93 and the second negative electrode bus bar extending portion 94 extends in the positive X axis direction in a parallel manner along the side wall portion 61*a* of the first module case 61 and the end surface 23A of the capacitor unit 23. The second positive electrode bus bar extending portion 93 extends such that it becomes closer toward the first positive electrode bus bar extending portion 83 on the power module 21 side. The second negative electrode bus bar extending portion 94 extends such that it becomes closer toward the first negative electrode bus bar extending portion 84 on the power module 21 side.

A main surface of each of the second positive electrode bus bar extending portion 93 and the second negative electrode bus bar extending portion 94 is disposed parallel to a direction (Z axis direction) orthogonal to each of the mounting surfaces 71C and 71D of each of the element modules MU1, MV1, MW1, MU2, MV2, MW2, and MS. The main surfaces of the extending portions 93 and 94 are surfaces having the largest surface area, that is, surfaces 93A and 93B of the second positive electrode bus bar extending portion 93 on sides in the positive and negative Y axis directions and surfaces 94A and 94B of the second negative electrode bus bar extending portion 94 on sides in the positive and negative Y axis directions, for example.

The second positive electrode bus bar extending portion 93 includes a conductive extending main body portion 93*a* which is integrally electrically connected to the drawing main body portion 91*a* of the positive electrode bus bar drawing portion 91 and an insulating film 93*b* which has electrical insulating properties and with which a surface of the extending main body portion 93*a* is coated.

The second negative electrode bus bar extending portion 94 includes a conductive extending main body portion 94*a* which is integrally electrically connected to the drawing main body portion 92*a* of the negative electrode bus bar drawing portion 92 and an insulating film 94*b* which has electrical insulating properties and with which a surface of the extending main body portion 94*a* is coated.

The second positive electrode bus bar extending portion 93 and the second negative electrode bus bar extending portion 94 are disposed such that they are substantially parallel to each other and are stacked in the thickness directions thereof. For example, the length of the second positive electrode bus bar extending portion 93 in the X axis direction is formed to be relatively shorter than the length of the second negative electrode bus bar extending portion 94 in the X axis direction.

The tip portion (that is, the end portion in the negative X axis direction) of the second positive electrode bus bar extending portion 93 comes into contact with the tip portion (that is, the end portion in the positive X axis direction) of the first positive electrode bus bar extending portion 83 on the capacitor unit 23 side such that they are stacked in the Y axis direction.

The tip portion (that is, the end portion in the negative X axis direction) of the second negative electrode bus bar extending portion 94 comes into contact with the tip portion (that is, the end portion in the positive X axis direction) of the first negative electrode bus bar extending portion 84 on the capacitor unit 23 side such that they are stacked in the Y axis direction.

For example, each of the second positive electrode bus bar stretching portion 95 and the second negative electrode bus bar stretching portion 96 is formed to have a plate-like external shape extending in a direction away from the tip portion (that is, the end portion in the negative X axis direction) of each of the second positive electrode bus bar extending portion 93 and the second negative electrode bus bar extending portion 94 between the capacitor unit 23 and the first module case 61. For example, the direction in which each of the second positive electrode bus bar stretching portion 95 and the second negative electrode bus bar stretching portion 96 extends is the positive Z axis direction parallel to the side wall portion 61*a* of the first module case 61.

A main surface of each of the second positive electrode bus bar stretching portion 95 and the second negative electrode bus bar stretching portion 96 is disposed parallel to a direction (Z axis direction) orthogonal to each of the mounting surfaces 71C and 71D of each of the element modules MU1, MV1, MW1, MU2, MV2, MW2, and MS. The main surfaces of the stretching portions 95 and 96 are surfaces having the largest surface area, that is, surfaces of the second positive electrode bus bar stretching portion 95 on sides in the positive and negative Y axis directions and surfaces of the second negative electrode bus bar stretching portion 96 on sides in the positive and negative Y axis directions, for example. The surface 95A, of the main surfaces of the second positive electrode bus bar stretching portion 95, on a side in the negative Y axis direction faces the surface 85A of the foregoing first positive electrode bus bar stretching portion 85 on a side in the positive Y axis direction on the first module case 61 side. The surface 96A, of the main surfaces of the second negative electrode bus bar stretching portion 96, on a side in the negative Y axis direction faces the surface 86A of the foregoing first negative electrode bus bar stretching portion 86 on a side in the positive Y axis direction on the first module case 61 side.

For example, the second positive electrode bus bar stretching portion 95 is provided with a predetermined gap for disposing the foregoing first positive electrode bus bar stretching portion 85 on the power module 21 side between the second positive electrode bus bar stretching portion 95 and the second negative electrode bus bar extending portion 94 in the thickness direction (that is, the Y axis direction).

The second positive electrode bus bar stretching portion 95 includes a conductive main body portion (not shown) and an insulating film (not shown) having electrical insulating properties, which are integrally connected to each of the conductive extending main body portion 93*a* and the insulating film 93*b* having electrical insulating properties of the second positive electrode bus bar extending portion 93. The second positive electrode bus bar stretching portion 95 includes a conductive second positive electrode bus bar exposed portion 95a exposed from the insulating film in a predetermined range (for example, the entire region or the like leading to the tip portion of the second positive electrode bus bar extending portion 93) from the tip portion in the extending direction (that is, the positive Z axis direction).

For example, the length of the second positive electrode bus bar exposed portion 95a in the Z axis direction is formed such that a distance between the tip portion of the second positive electrode bus bar exposed portion 95a and the insulating film 93b of the second positive electrode bus bar extending portion 93 becomes the predetermined distance L or longer. For example, the predetermined distance L is a distance or the like required to curb thermal damage to the insulating film 93b caused by heat generated during welding work of laser welding or the like in the second positive electrode bus bar exposed portion 95a.

The second positive electrode bus bar exposed portion 95a is stacked on the first positive electrode bus bar exposed portion 85a on the power module 21 side in the thickness direction (that is, the Y axis direction) and is electrically bonded through laser welding or the like. Accordingly, the second positive electrode bus bar exposed portion 95a extends such that it becomes closer to the tip portion of the first positive electrode bus bar extending portion 83 from the first positive electrode bus bar exposed portion 85a on the power module 21 side.

The second negative electrode bus bar stretching portion 96 includes a conductive main body portion (not shown) and an insulating film (not shown) having electrical insulating properties, which are integrally connected to each of the conductive extending main body portion 94a and the insulating film 94b having electrical insulating properties of the second negative electrode bus bar extending portion 94. The second negative electrode bus bar stretching portion 96 includes a conductive second negative electrode bus bar exposed portion 96a exposed from the insulating film in a predetermined range (for example, the entire region or the like leading to the tip portion of the second negative electrode bus bar extending portion 94) from the tip portion in the extending direction (that is, the positive Z axis direction).

For example, the length of the second negative electrode bus bar exposed portion 96a in the Z axis direction is formed such that a distance between the tip portion of the second negative electrode bus bar exposed portion 96a and the insulating film 94b of the second negative electrode bus bar extending portion 94 becomes the predetermined distance L or longer. For example, the predetermined distance L is a distance or the like required to curb thermal damage to the insulating film 94b caused by heat generated during welding work of laser welding or the like in the second negative electrode bus bar exposed portion 96a.

The second negative electrode bus bar exposed portion 96a is stacked on the first negative electrode bus bar exposed portion 86a on the power module 21 side in the thickness direction (that is, the Y axis direction) and is electrically bonded through laser welding or the like. Accordingly, the second negative electrode bus bar exposed portion 96a extends such that it becomes closer to the tip portion of the first negative electrode bus bar extending portion 84 from the first negative electrode bus bar exposed portion 86a on the power module 21 side.

Hereinabove, the first connection portion 80a between the first power conversion circuit portion 31 and the capacitor unit 23 has been described. However, the second connection portion 80b between the second power conversion circuit portion 32 and the capacitor unit 23 is provided around a side wall portion 62a of the second module case 62 in place of the side wall portion 61a of the first module case 61.

In addition, the third connection portion 80c between the third power conversion circuit portion 33 and the capacitor unit 23 is provided around a side wall portion 63a of the third module case 63 in place of the side wall portion 61a of the first module case 61. Compared to the first connection portion 80a, the third connection portion 80c includes the positive electrode bus bar PV and the negative electrode bus bar NV in place of the positive electrode bus bar PI and the negative electrode bus bar NI.

For example, in the third connection portion 80c, the positive electrode bus bar drawing portion 91 and the negative electrode bus bar drawing portion 92 are formed to have a plate-like external shape which is bent in an L-shape along an end surface 23C on a side in the negative Y axis direction and the end surface 23B on a side in the positive X axis direction from the end portion of the capacitor unit 23 on a side in the negative Z axis direction and extends in the positive Y axis direction.

Hereinafter, a step of connecting each of the positive and negative electrode bus bars PI, PV, NI, and NV of the power module 21 and each of the positive and negative electrode bus bars 50p and 50n of the capacitor unit 23 in the power conversion apparatus 1 will be described. FIGS. 11 to 14 are perspective views schematically showing first to fourth states in a step of assembling the power conversion apparatus 1.

Figure 11:
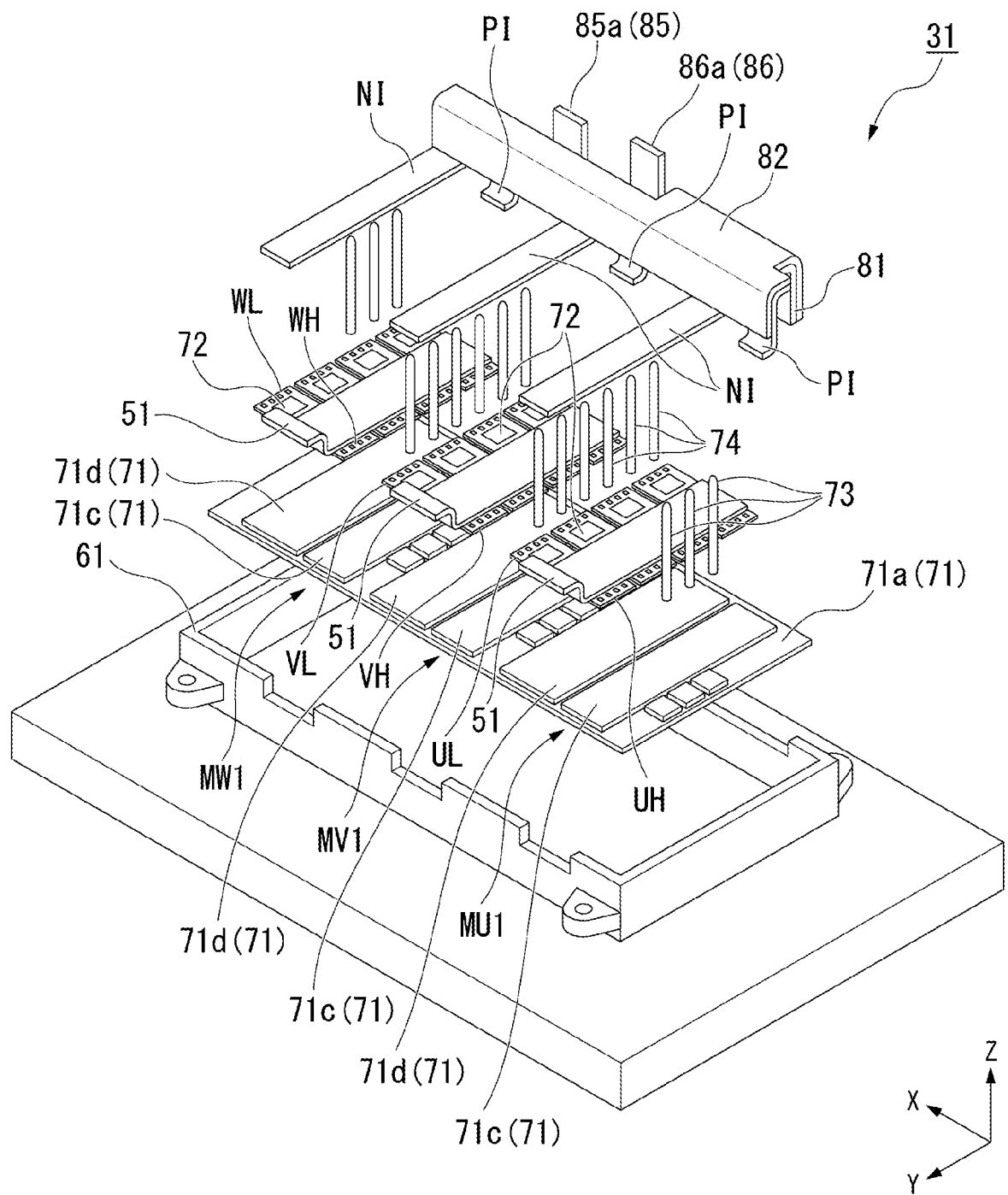
FIG. 11 is a perspective view showing an example of a step of connecting each of the positive and negative electrode bus bars of the power module and each of the positive and negative electrode bus bars of the capacitor unit to each other in the power conversion apparatus of the embodiment of the present invention.

First, as shown in FIG. 11, in each of the first, second, and third power conversion circuit portions 31, 32, and 33 of the power module 21, for example, the constituent component of each of the element modules MU1, MV1, MW1, MU2, MV2, MW2, and MS is mounted inside each of the module cases 61, 62, and 63 through soldering or the like.

Figure 12:
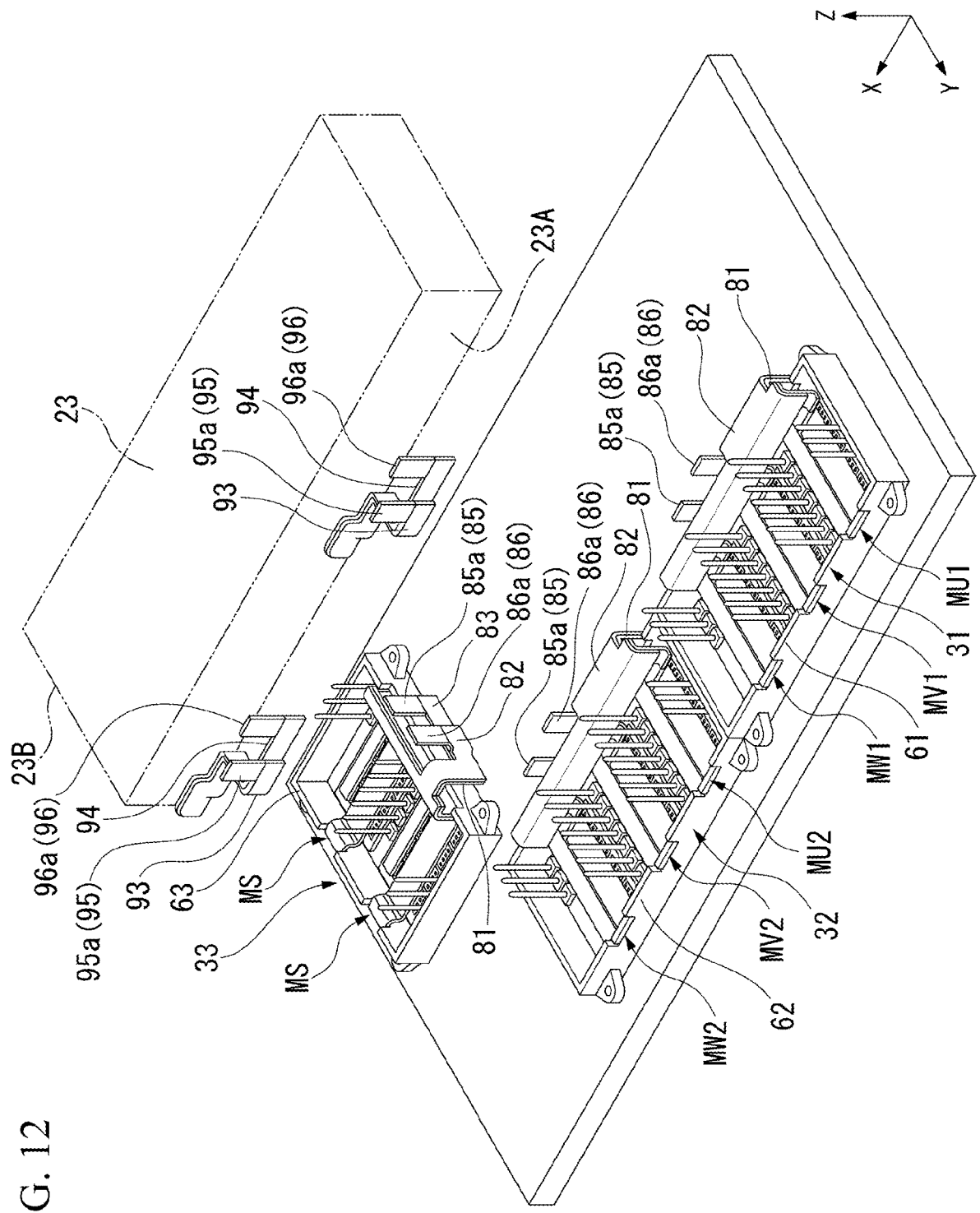
FIG. 12 is another perspective view showing the example of the step of connecting each of the positive and negative electrode bus bars of the power module and each of the positive and negative electrode bus bars of the capacitor unit to each other in the power conversion apparatus of the embodiment of the present invention.

Next, as shown in FIG. 12, the capacitor unit 23 is mounted at a predetermined relative position with respect to the power module 21.

Figure 13:
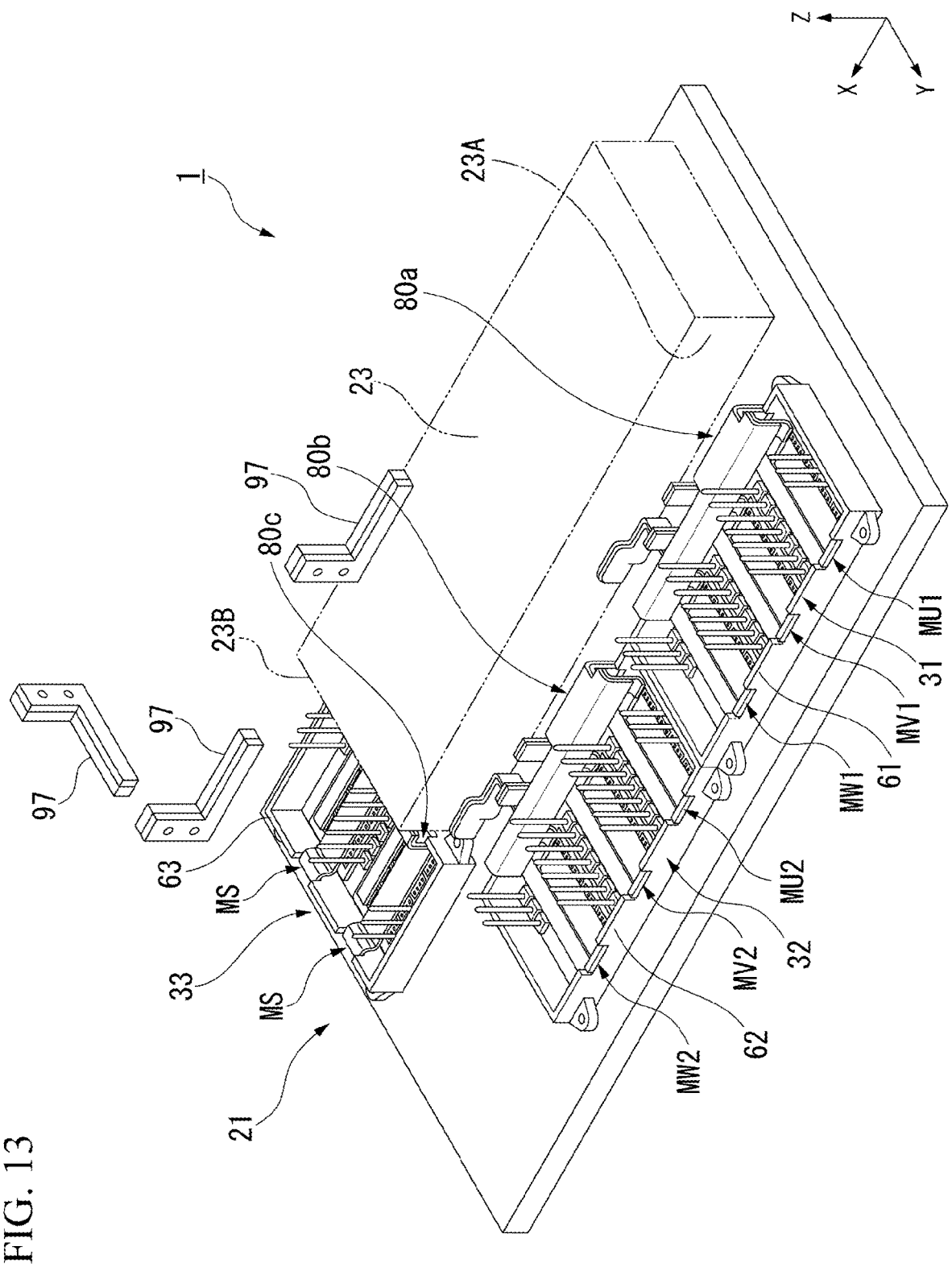
FIG. 13 is another perspective view showing the example of the step of connecting each of the positive and negative electrode bus bars of the power module and each of the positive and negative electrode bus bars of the capacitor unit to each other in the power conversion apparatus of the embodiment of the present invention.
Figure 14:
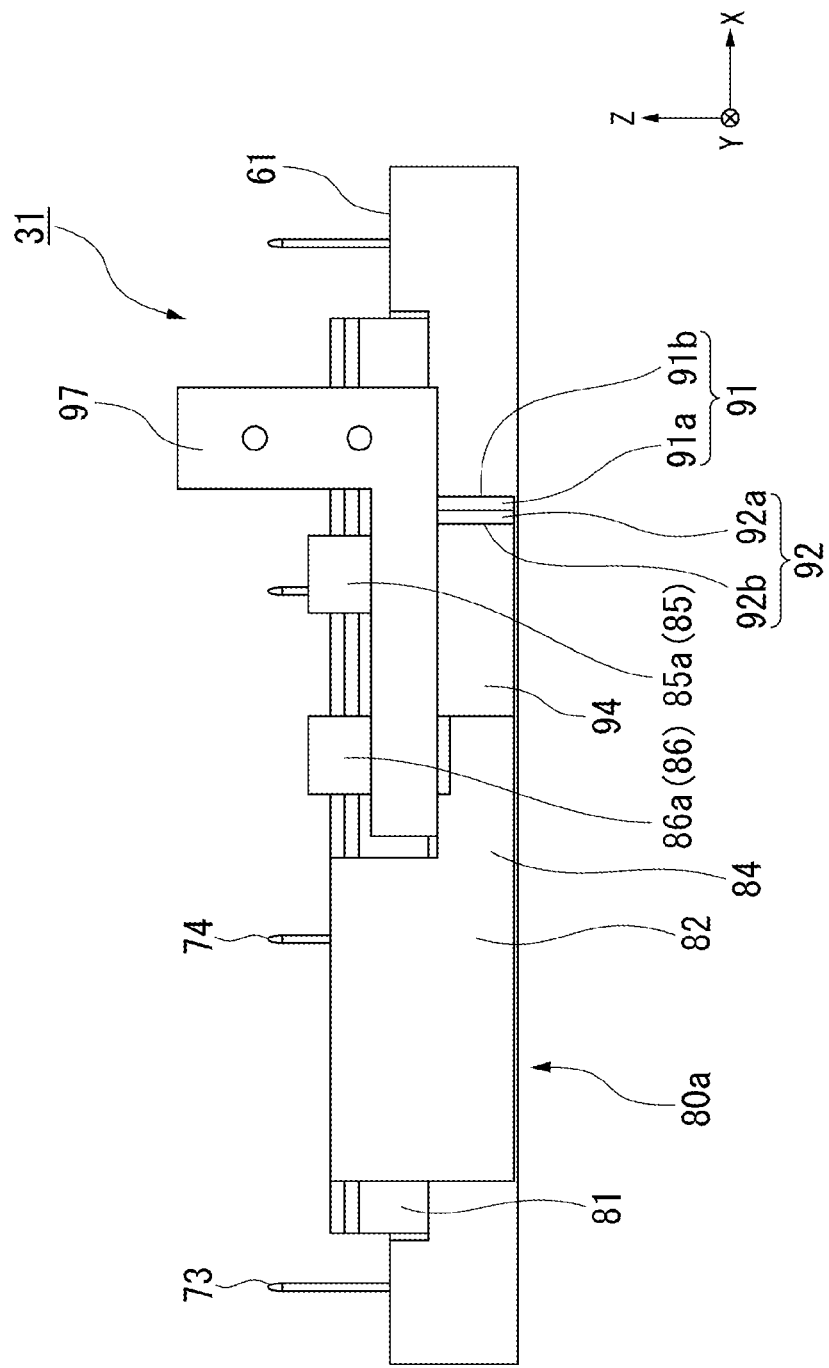
FIG. 14 is another perspective view showing the example of the step of connecting each of the positive and negative electrode bus bars of the power module and each of the positive and negative electrode bus bars of the capacitor unit to each other in the power conversion apparatus of the embodiment of the present invention.

Next, as shown in FIGS. 13 and 14, for example, the first positive electrode bus bar exposed portion 85a on the power module 21 side and the second positive electrode bus bar exposed portion 95a on the capacitor unit 23 side, and the first negative electrode bus bar exposed portion 86a on the power module 21 side and the second negative electrode bus bar exposed portion 96a on the capacitor unit 23 side are fixed to each other respectively using jigs 97 such as chucks sandwiching each of the bus bar pairs therebetween from both sides in a stacking direction. The jigs 97 are formed of a material having high thermal conductivity, such as copper, for example.

Next, for example, the first positive electrode bus bar exposed portion 85a on the power module 21 side and the second positive electrode bus bar exposed portion 95a on the capacitor unit 23 side, and the first negative electrode bus bar exposed portion 86a on the power module 21 side and the second negative electrode bus bar exposed portion 96a on the capacitor unit 23 side are bonded to each other respectively through laser welding or the like, and the jigs 97 are detached.

In this manner, a series of steps ends.

As described above, according to the power conversion apparatus 1 of the present embodiment, between the power module 21 and the capacitor unit 23, the positive electrode bus bar extending portions 83 and 93, and the negative electrode bus bar extending portions 84 and 94 face each other and extend in a parallel manner along each of the module cases 61, 62, and 63. Accordingly, it is possible to curb increase in space necessary for electrical connection between each of the positive bus bars PI and PV and each of the negative electrode bus bars NI and NV on the power module 21 side and the positive electrode bus bar 50*p* and the negative electrode bus bar 50*n* on the capacitor unit 23 side. In addition, in each of the positive electrode bus bar extending portions 83 and 93 and each of the negative electrode bus bar extending portions 84 and 94, the directions in which currents thereof flow become directions opposite to each other, and thus increase in stray inductance can be curbed due to interaction of weakening magnetic fluxes thereof.

In addition, the surfaces 83B and 93B of the respective positive electrode bus bar extending portions 83 and 93, and the surfaces 84A and 94A of the respective negative electrode bus bar extending portions 84 and 94 face each other. Therefore, increase in stray inductance can be curbed. In addition, each of the surfaces 83B, 93B, 84A, and 94A is disposed parallel to the Z axis direction orthogonal to each of the mounting surfaces 71C and 71D. Therefore, increase in space necessary for electrical connection in a direction parallel to each of the mounting surfaces 71C and 71D can be curbed.

In addition, the surfaces 85A and 95A of the respective positive electrode bus bar stretching portions 85 and 95 face each other. Therefore, the first positive electrode bus bar stretching portion 85 and the second positive electrode bus bar stretching portion 95 can be easily bonded to each other, and increase in space necessary for electrical connection can be curbed. In addition, the directions in which currents thereof flow become directions opposite to each other. Therefore, increase in stray inductance can be curbed due to interaction of weakening magnetic fluxes thereof.

In addition, the surfaces 85A and 95A of the respective positive electrode bus bar stretching portions 85 and 95 are disposed parallel to the Z axis direction orthogonal to each of the mounting surfaces 71C and 71D. Therefore, increase in space necessary for electrical connection in a direction parallel to each of the mounting surfaces 71C and 71D can be curbed.

In addition, the surfaces 86A and 96A of the respective negative electrode bus bar stretching portions 86 and 96 face each other. Therefore, the first negative electrode bus bar stretching portion 86 and the second negative electrode bus bar stretching portion 96 can be easily bonded to each other, and increase in space necessary for electrical connection can be curbed. In addition, the directions in which currents thereof flow become directions opposite to each other. Therefore, increase in stray inductance can be curbed due to interaction of weakening magnetic fluxes thereof.

In addition, the surfaces 86A and 96A of the respective negative electrode bus bar stretching portions 86 and 96 are disposed parallel to the Z axis direction orthogonal to each of the mounting surfaces 71C and 71D. Therefore, increase in space necessary for electrical connection in a direction parallel to each of the mounting surfaces 71C and 71D can be curbed.

In addition, deterioration or damage occurring in each of the insulating films 83*b* and 93*b* due to heat can be curbed by including each of the positive electrode bus bar exposed portions 85*a* and 95*a* bonded to each other through welding or the like.

In addition, deterioration or damage occurring in each of the insulating films 84*b* and 94*b* due to heat can be curbed by including each of the negative electrode bus bar exposed portions 86*a* and 96*a* bonded to each other through welding or the like.

In addition, the positive electrode bus bar exposed portions 85*a* and 95*a*, and the negative electrode bus bar exposed portions 86*a* and 96*a* are fixed to each other using the respective jigs 97. Therefore, the accuracy at a bonding position thereof can be improved. In addition, heat generated during bonding work such as welding can escape to the jigs 97, and thus occurrence of thermal damage to each of the insulating films 83*b*, 93*b*, 84*b*, 94*b*, and the like can be curbed.

Hereinafter, a modification example of the embodiment will be described.

In the embodiment described above, the relative disposition relationship between each of the members on the positive electrode side and each of the members on the negative electrode side in each of the connection portions 80*a*, 80*b*, and 80*c* may be switched.

In the embodiment described above, the power conversion apparatus 1 is mounted in the vehicle 10, but the embodiment is not limited thereto. The power conversion apparatus 1 may be mounted in other equipment.

The embodiment of the present invention has been presented as an example and is not intended to limit the scope of the invention. The embodiment thereof can be performed in various other forms and can be subjected to various omissions, replacements, and changes within a range not departing from the gist of the invention. The embodiment and the modifications thereof are included in the invention disclosed in the claims and a range equivalent thereto as they are included in the scope and the gist of the invention.

EXPLANATION OF REFERENCES

1 Power conversion apparatus
10 Vehicle
11 Battery
12 First motor
13 Second motor
21 Power module (semiconductor module)
23 Capacitor unit (capacitor)
31 First power conversion circuit portion
32 Second power conversion circuit portion
33 Third power conversion circuit portion
50*p* Positive electrode bus bar (first conductor)
50*n* Negative electrode bus bar (second conductor)
61 First module case
62 Second module case
63 Third module case
71C, 71D Mounting surface (disposition surface)
80*a* First connection portion
80*b* Second connection portion
80*c* Third connection portion
81 Positive electrode bus bar bent portion (first conductor)
81*b* Insulating coating (insulating material)
82 Negative electrode bus bar bent portion (second conductor)
82*b* Insulating coating (insulating material)
83 First positive electrode bus bar extending portion (first conductor, first part)
83*b* Insulating coating (insulating material)
83A, 83B Surface (main surface)
84 First negative electrode bus bar extending portion (second conductor, third part)

84*b* Insulating coating (insulating material)
84A, 84B Surface (main surface)
85 First positive electrode bus bar stretching portion (first conductor, first stretching portion)
85*a* First positive electrode bus bar exposed portion (exposed portion)
85A Surface (main surface)
86 First negative electrode bus bar stretching portion (second conductor, third stretching portion)
86*a* First negative electrode bus bar exposed portion (exposed portion)
86A Surface (main surface)
91 Positive electrode bus bar drawing portion (first conductor)
91*b* Insulating coating (insulating material)
92 Negative electrode bus bar drawing portion (second conductor)
92*b* Insulating coating (insulating material)
93 Second positive electrode bus bar extending portion (first conductor, second part)
93*b* Insulating coating (insulating material)
93A, 93B Surface (main surface)
94 Second negative electrode bus bar extending portion (second conductor, fourth part)
94*b* Insulating coating (insulating material)
94A, 94B Surface (main surface)
95 Second positive electrode bus bar stretching portion (first conductor, second stretching portion)
95*a* Second positive electrode bus bar exposed portion (exposed portion)
95A Surface (main surface)
96 Second negative electrode bus bar stretching portion (second conductor, fourth stretching portion)
96*a* Second negative electrode bus bar exposed portion (exposed portion)
96A Surface (main surface)
PI, PV Positive electrode bus bar (first conductor)
NI, NV Negative electrode bus bar (second conductor)

What is claimed is:

1. A power conversion apparatus comprising:
a semiconductor module;
a capacitor that is electrically connected to the semiconductor module; and
first conductors and second conductors that connect the semiconductor module and the capacitor to each other and have polarities different from each other,
wherein the first conductors include
a first part which extends in a first direction,
a second part which extends in a second direction,
a first stretching portion which extends in a direction away from the first part in a direction intersecting the first direction and the second direction, and
a second stretching portion which extends in a direction toward the second part from the first stretching portion and is connected to the second part in a direction intersecting the first direction and the second direction, and
wherein the second conductors include
a third part which extends in a manner of being relatively shorter than the first part in the first direction in a state of facing the first part,
a fourth part which extends in the second direction in a state of facing the first part or the second part,
a third stretching portion which extends in a direction away from the third part in a direction intersecting the first direction and the second direction, and
a fourth stretching portion which extends in a direction toward the fourth part from the third stretching portion and is connected to the fourth part in a direction intersecting the first direction and the second direction.

2. The power conversion apparatus according to claim 1, wherein the first direction and the second direction are included within the same plane.

3. The power conversion apparatus according to claim 1, wherein each of the first stretching portion and the second stretching portion has a plate-like external shape, and
wherein a main surface of the first stretching portion and a main surface of the second stretching portion face each other.

4. The power conversion apparatus according to claim 3, wherein the main surface of each of the first stretching portion and the second stretching portion is disposed parallel to a direction intersecting a disposition surface of the semiconductor module.

5. The power conversion apparatus according to claim 1, wherein each of the third stretching portion and the fourth stretching portion has a plate-like external shape, and
wherein a main surface of the third stretching portion and a main surface of the fourth stretching portion face each other.

6. The power conversion apparatus according to claim 5, wherein the main surface of each of the third stretching portion and the fourth stretching portion is disposed parallel to a direction intersecting a disposition surface of the semiconductor module.

7. The power conversion apparatus according to claim 1, wherein each of the first conductors and the second conductors includes an insulating material covering a surface thereof, and
wherein each of the first stretching portion and the second stretching portion includes an exposed portion exposed from the insulating material.

8. The power conversion apparatus according to claim 1, wherein each of the first conductors and the second conductors includes an insulating material covering a surface thereof, and
wherein each of the third stretching portion and the fourth stretching portion includes an exposed portion exposed from the insulating material.

9. The power conversion apparatus according to claim 1, wherein the semiconductor module and the capacitor are disposed away from each other in a direction orthogonal to the first direction, and
wherein the first part, the second part, the third part, and the fourth part are disposed between the semiconductor module and the capacitor.

10. The power conversion apparatus according to claim 1, wherein each of the first part, the second part, the third part, and the fourth part has a plate-like external shape, and
wherein a main surface of each of the first part, the second part, the third part, and the fourth part is disposed parallel to a direction intersecting a disposition surface of the semiconductor module.

* * * * *